US012154800B2

(12) United States Patent
Kitazawa et al.

(10) Patent No.: US 12,154,800 B2
(45) Date of Patent: Nov. 26, 2024

(54) HEAT TREATMENT APPARATUS AND HEAT TREATMENT METHOD

(71) Applicant: SCREEN Holdings Co., Ltd., Kyoto (JP)

(72) Inventors: Takahiro Kitazawa, Kyoto (JP); Yukio Ono, Kyoto (JP); Oma Nakajima, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 283 days.

(21) Appl. No.: 17/777,586

(22) PCT Filed: Oct. 21, 2020

(86) PCT No.: PCT/JP2020/039550
§ 371 (c)(1),
(2) Date: May 17, 2022

(87) PCT Pub. No.: WO2021/131276
PCT Pub. Date: Jul. 1, 2021

(65) Prior Publication Data
US 2023/0018090 A1    Jan. 19, 2023

(30) Foreign Application Priority Data

Dec. 24, 2019 (JP) ................. 2019-232583

(51) Int. Cl.
*H01L 21/67* (2006.01)
(52) U.S. Cl.
CPC .. *H01L 21/67115* (2013.01); *H01L 21/67248* (2013.01)

(58) Field of Classification Search
CPC ................ H01L 21/67115; H01L 21/67248
See application file for complete search history.

(56) References Cited

U.S. PATENT DOCUMENTS

2005/0063453 A1   3/2005  Camm et al.
2005/0120961 A1   6/2005  Kubo
(Continued)

FOREIGN PATENT DOCUMENTS

JP    2004-186542 A    7/2004
JP    2005-515425 A    5/2005
(Continued)

OTHER PUBLICATIONS

International Search Report mailed Jan. 12, 2021 in corresponding PCT International Application No. PCT/JP2020/039550.
(Continued)

*Primary Examiner* — Sean M Luck
(74) *Attorney, Agent, or Firm* — OSTROLENK FABER LLP

(57) ABSTRACT

Even a radiation thermometer using a quantum infrared sensor appropriately measures the temperature of a substrate irradiated with a flash of light. A heat treatment apparatus includes a quantum infrared sensor configured to measure a temperature of the first substrate and a temperature of the second substrate. The heat treatment apparatus further includes a temperature correction unit configured to correct, using a correction coefficient calculated based on the reference temperature and the shift temperature, a temperature of the second substrate on which second heat treatment having irradiation with the flash of light is performed, the temperature being measured by the quantum infrared sensor.

7 Claims, 16 Drawing Sheets

(56) References Cited

U.S. PATENT DOCUMENTS

| | | |
|---|---|---|
| 2006/0086713 A1 | 4/2006 | Hunter et al. |
| 2009/0011606 A1* | 1/2009 | Shinozaki ............ C23C 16/482 |
| | | 438/758 |
| 2017/0194220 A1 | 7/2017 | Lieberer et al. |

FOREIGN PATENT DOCUMENTS

| | | |
|---|---|---|
| JP | 2005-174986 A | 6/2005 |
| JP | 2010-225613 A | 10/2010 |
| JP | 2012-156522 A | 8/2012 |
| JP | 2016-207721 A | 12/2016 |
| JP | 2018-535542 A | 11/2018 |
| KR | 10-2007-0060158 A | 6/2007 |
| KR | 10-2018-0030231 A | 3/2018 |

OTHER PUBLICATIONS

Written Opinion mailed Jan. 12, 2021 in corresponding PCT International Application No. PCT/JP2020/039550.
Decision of Grant dated Sep. 5, 2023 in corresponding Japanese Patent Application No. 2019-232583.
Decision of Grant dated Sep. 24, 2024 in corresponding Korean Patent Application No. 10-2022-7021239.

* cited by examiner

F I G. 5
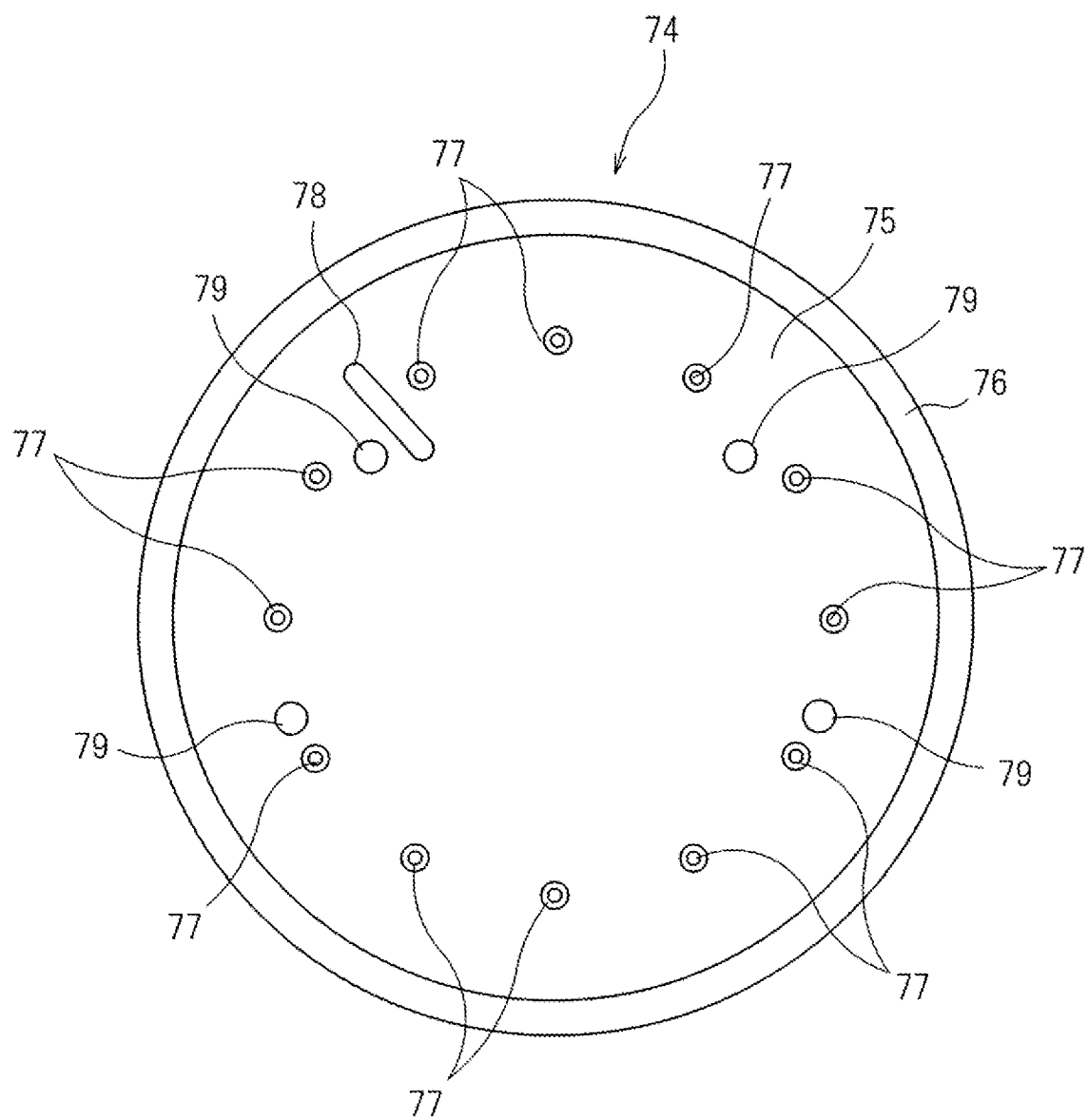

F I G. 6
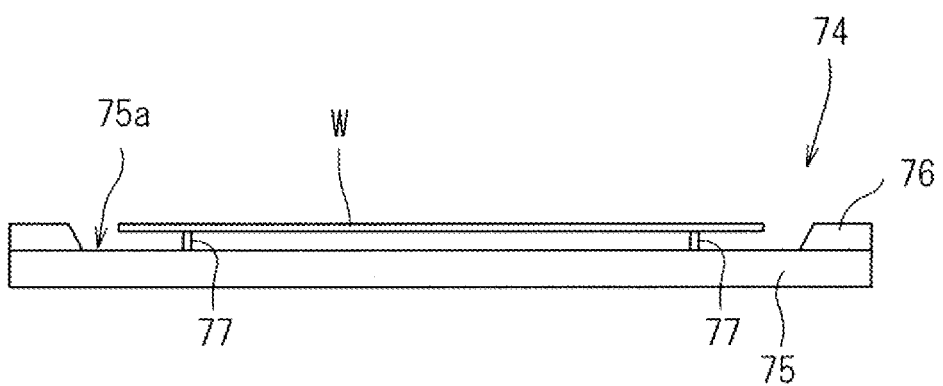

F I G. 1 1
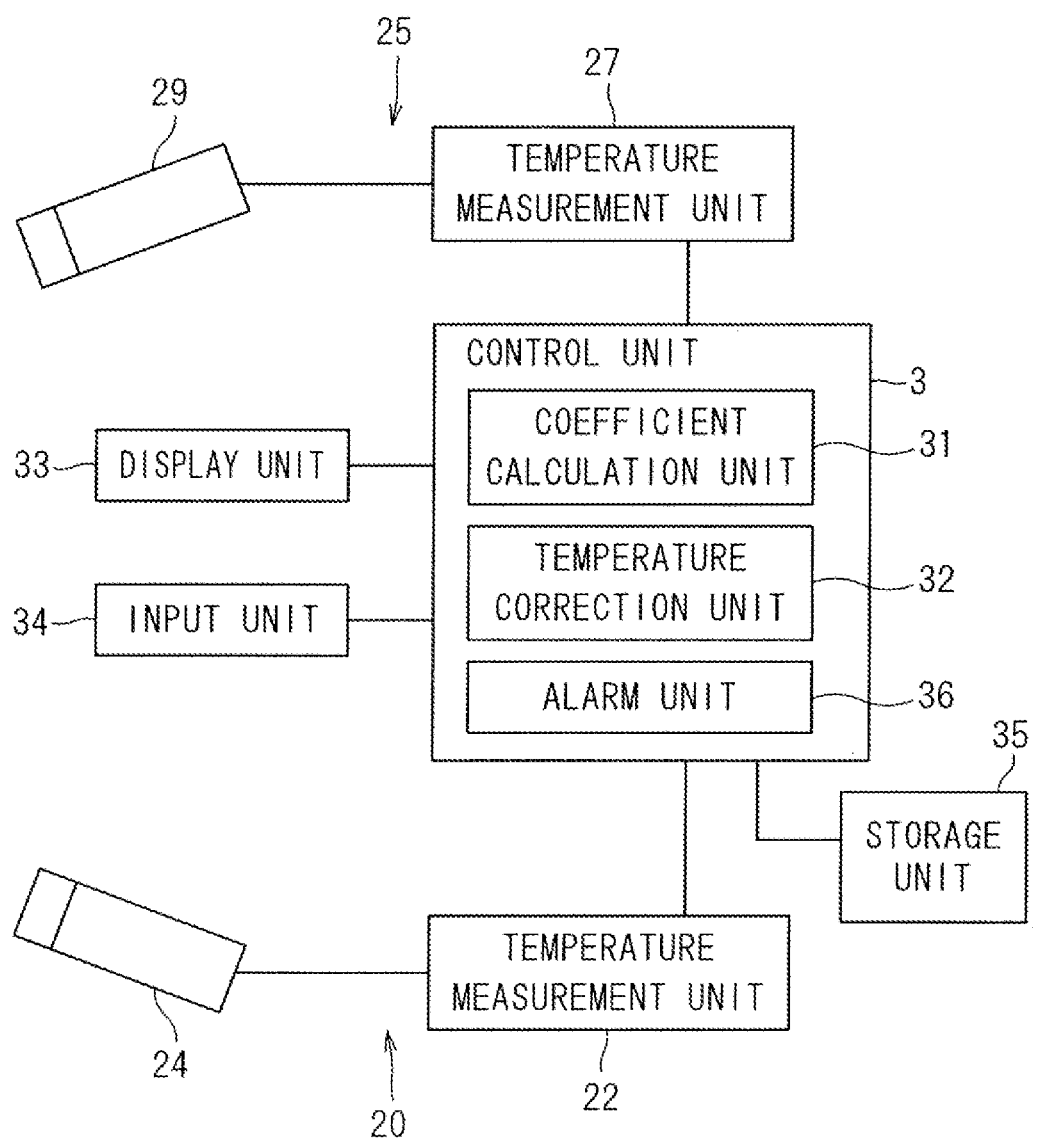

F I G. 1 5

| CF | | |
|---|---|---|
| | 1 | 1.000 |
| | 2 | 0.800 |
| | 3 | 0.600 |
| | 4 | 0.900 |
| | 5 | 1.000 |
| | 6 | 1.000 |
| | 7 | 1.000 |
| | 8 | 1.000 |
| | 9 | 1.000 |
| | 10 | 1.000 |
| | 11 | 1.000 |
| | 12 | 1.000 |

HEAT TREATMENT APPARATUS AND HEAT TREATMENT METHOD

CROSS-REFERENCE TO RELATED APPLICATIONS

The present application is a 35 U.S.C. §§ 371 national phase conversion of International Application No. PCT/JP2020/039550, filed Oct. 21, 2020, which claims priority to Japanese Patent Application No. 2019-232583, filed Dec. 24, 2019, the contents of both of which are incorporated herein by reference. The PCT International Application was published in the Japanese language.

TECHNICAL FIELD

The technique disclosed in the specification of the present application relates to a heat treatment apparatus and a heat treatment method.

BACKGROUND ART

In a manufacturing process of a semiconductor device, impurity doping is a step necessary for forming a pn junction or the like inside a thin-plate shaped precision electronic substrate (hereinafter, may be simply referred to as a "substrate") such as a semiconductor wafer. It is common to perform impurity doping by an ion implantation process and a subsequent annealing process.

The ion implantation process is a technique for causing impurity elements such as boron (B), arsenic (As), and phosphorus (P) to ionize and to collide against the semiconductor wafer with high acceleration voltage, and physically performing impurity implantation.

The implanted impurities are activated by the annealing treatment. On this occasion, when the annealing time is about several seconds or more, the implanted impurities are deeply diffused by heat, and as a result, the junction depth may become too large as compared with the required depth, and thus, this may hinder the formation of a good device.

Thus, attention has been given to flash lamp anneal (FLA) as an annealing technique for heating a semiconductor wafer in an extremely short time. The FLA is a heat treatment technique in which irradiating a front-surface of a semiconductor wafer with a flash of light using a xenon flash lamp (hereinafter, when the term "flash lamp" is simply used, it means a xenon flash lamp) raises the temperature of only the front-surface of the semiconductor wafer implanted with impurities in an extremely short time (such as several milliseconds or less).

The xenon flash lamp has a spectral distribution of radiation ranging from ultraviolet to near-infrared regions. The wavelength of light emitted from the xenon flash lamp is shorter than that of light emitted from a conventional halogen lamp, and approximately coincides with a fundamental absorption band of a silicon semiconductor wafer. Thus, when a semiconductor wafer is irradiated with a flash of light from the xenon flash lamp, the temperature of the semiconductor wafer can be rapidly raised due to a small amount of transmitted light. In addition, it has also turned out that the irradiation with a flash of light in an extremely short time of several milliseconds or less allows a selective temperature rise only near the front-surface of the semiconductor wafer. Therefore, the temperature rise in an extremely short time with the xenon flash lamp allows the impurity activation to be performed without deep diffusion of the impurities.

For example, Patent Document 1 discloses a flash lamp annealing apparatus in which a semiconductor wafer is preheated by a heating plate disposed below a treatment chamber, and then a front-surface of the semiconductor wafer is irradiated with a flash of light from a flash lamp disposed above the treatment chamber.

PRIOR ART DOCUMENT

Patent Document

Patent Document 1: Japanese Patent Application Laid-Open No. 2004-186542

SUMMARY

Problem to be Solved by the Invention

In the flash lamp anneal, since the temperature of the front-surface of the substrate irradiated with a flash of light rises in a short time, a thermometer capable of responding with high speed is required in order to measure the temperature of the front-surface of the substrate irradiated with a flash of light. Examples of such a thermometer capable of responding with high speed include a radiation thermometer using a quantum infrared sensor.

However, the radiation thermometer using the quantum infrared sensor has a problem that the output voltage may vary with a lapse of time, and it has been difficult to measure the temperature with high precision.

The technique disclosed in the specification of the present application has been made in view of the problems as described above, and is a technique for appropriately measuring the temperature of a substrate irradiated with a flash of light even with a radiation thermometer using a quantum infrared sensor.

Means to Solve the Problem

A first aspect of the technique disclosed in the specification of the present application is a heat treatment apparatus configured to heat a first substrate and a second substrate by irradiation with a flash of light, the heat treatment apparatus including a quantum infrared sensor configured to measure a temperature of the first substrate and a temperature of the second substrate. A temperature of the first substrate on which first heat treatment having irradiation with the flash of light is performed, the temperature being measured by the quantum infrared sensor, is defined as a reference temperature. A temperature of the first substrate on which the first heat treatment is performed and then the first heat treatment is performed again, the temperature being measured by the quantum infrared sensor, is defined as a shift temperature. The heat treatment apparatus further includes a temperature correction unit configured to correct, using a correction coefficient calculated based on the reference temperature and the shift temperature, a temperature of the second substrate on which second heat treatment having irradiation with the flash of light is performed, the temperature being measured by the quantum infrared sensor.

A second aspect of the technique disclosed in the specification of the present application relates to the first aspect, and the correction coefficient is calculated based on a ratio between the reference temperature and the shift temperature.

A third aspect of the technique disclosed in the specification of the present application relates to the first or second aspect, and the correction coefficient is calculated based on the reference temperature and the shift temperature, at least one of the reference temperature and the shift temperature being an average value of temperatures of the first substrate measured a plurality of times.

A fourth aspect of the technique disclosed in the specification of the present application relates to any one of the first to third aspects, and the heat treatment apparatus further includes an alarm unit configured to issue an alarm when a difference between the reference temperature and the shift temperature exceeds a threshold value.

A fifth aspect of the technique disclosed in the specification of the present application relates to any one of the first to fourth aspects, and the quantum infrared sensor measures a temperature on at least an upper surface irradiated with the flash of light of the first substrate. The heat treatment apparatus further includes a lower surface thermometer configured to measure a temperature on at least a lower surface of the first substrate. A temperature on a lower surface of the first substrate before the first heat treatment is performed, the temperature being measured by the lower surface thermometer, is defined as an assist temperature. The temperature correction unit corrects a temperature of the second substrate using the correction coefficient calculated based on the reference temperature, the shift temperature, and the assist temperature.

A sixth aspect of the technique disclosed in the specification of the present application relates to the fifth aspect, and the correction coefficient is calculated based on a ratio between a difference between the reference temperature and the assist temperature and a difference between the shift temperature and the assist temperature.

A seventh aspect of the technique disclosed in the specification of the present application is a heat treatment method for heating a first substrate and a second substrate by irradiation with a flash of light, the heat treatment method including: measuring, using a quantum infrared sensor, a temperature of the first substrate on which first heat treatment having irradiation with the flash of light is performed, and defining a measured temperature of the first substrate as a reference temperature; measuring again a temperature of the first substrate on which the first heat treatment is performed using the quantum infrared sensor after the first heat treatment is performed, and defining a temperature of the first substrate measured again as a shift temperature; and correcting a temperature of the second substrate on which second heat treatment having irradiation with the flash of light is performed, the temperature being measured by the quantum infrared sensor, using a correction coefficient calculated based on the reference temperature and the shift temperature.

Effects of the Invention

According to the first to seventh aspects of the technique disclosed in the specification of the present application, even a radiation thermometer using a quantum infrared sensor can appropriately measure the temperature of a substrate irradiated with a flash of light.

In addition, the objects, features, aspects, and advantages related to the technique disclosed in the specification of the present application will become further apparent from the detailed description and the accompanying drawings shown hereinafter.

BRIEF DESCRIPTION OF DRAWINGS

FIG. 5 is a plan view of a susceptor.

FIG. 6 is a cross-sectional view of the susceptor.

FIG. 11 is a functional block diagram showing a relationship among the lower radiation thermometer, the upper radiation thermometer, and the control unit.

FIG. 15 is a diagram schematically showing an example of a correction coefficient table that holds a correction coefficient for each treatment recipe.

DESCRIPTION OF EMBODIMENTS

Figure 1:
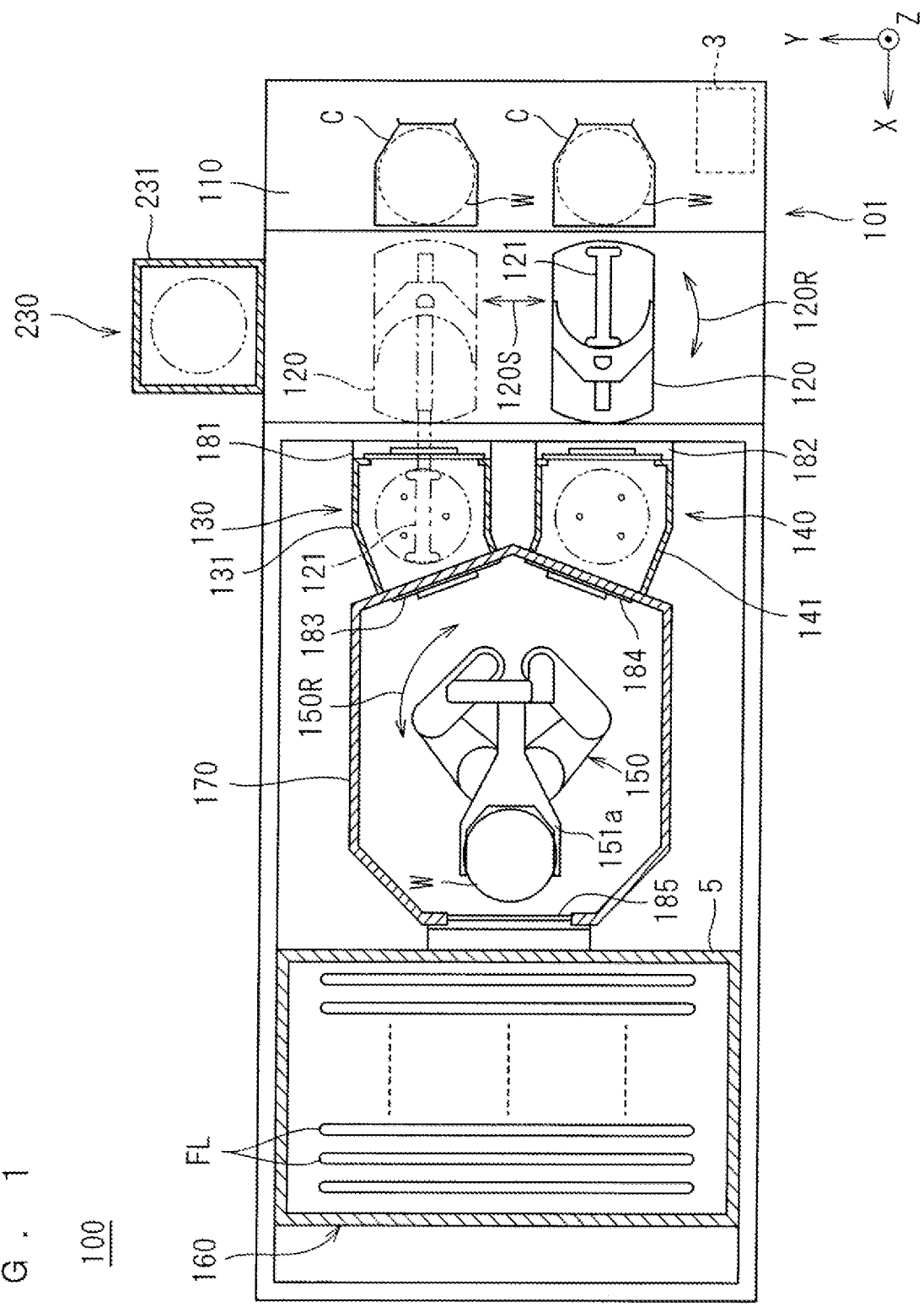
FIG. 1 is a plan view schematically showing an example of a configuration of a heat treatment system according to an embodiment.

Hereinafter, embodiments will be described with reference to the accompanying drawings. In the following embodiments, detailed features and the like are also shown for the description of the technique, but they are merely examples, and not all of them are necessarily essential features for enabling the embodiments to be carried out.

It should be noted that the drawings are schematically shown, and for convenience of description, the configuration may be omitted or the configuration may be simplified in the drawings as appropriate. In addition, the mutual relationship between the sizes and positions of the respective configurations shown in the different drawings is not necessarily described accurately and can be appropriately changed. In addition, in drawings such as plan views other than cross-sectional views, hatching may be added in order to facilitate understanding of the contents of the embodiments.

In addition, in the following description, the same components are denoted by the same reference numerals to be illustrated, and their names and functions are also the same. Therefore, detailed descriptions thereof may be omitted to avoid redundancy.

In addition, in the following description, when description such as "comprising", "including", or "having" a certain component is made, it is not an exclusive expression excluding the presence of other components unless otherwise noted.

In addition, in the following description, ordinal numbers such as "first" or "second" may be used, but these terms are used to facilitate understanding of the contents of the embodiments for convenience, and are not limited to the order or the like that can be generated by these ordinal numbers.

In addition, in the following description, an expression indicating an equal state, for example, "same", "equal", "uniform", or "homogeneous" is assumed to include a case indicating an exactly equal state and a case where a difference occurs within a range in which a tolerance or a similar function can be obtained, unless otherwise noted.

In addition, in the following description, terms that mean a specific position or direction such as "upper", "lower", "left", "right", "side", "bottom", "front", or "back" may be used, but these terms are used to facilitate understanding of the contents of the embodiments for convenience and are not related to the position or direction at the time of actual implementation.

First Embodiment

Hereinafter, a heat treatment apparatus and a heat treatment method in the heat treatment system according to the present embodiment will be described.
<Configuration of Heat Treatment System>

FIG. 1 is a plan view schematically showing an example of a configuration of a heat treatment system 100 according to the present embodiment. In addition, FIG. 2 is a front view schematically showing an example of a configuration of the heat treatment system 100 according to the present embodiment.

As shown in FIG. 1 as an example, the heat treatment system 100 is a flash lamp annealing apparatus that irradiates a disc-shaped semiconductor wafer W as a substrate with a flash of light to heat the semiconductor wafer W.

The size of the semiconductor wafer W to be treated is not particularly limited, and is, for example, φ 300 mm or φ 450 mm.

Figure 2:
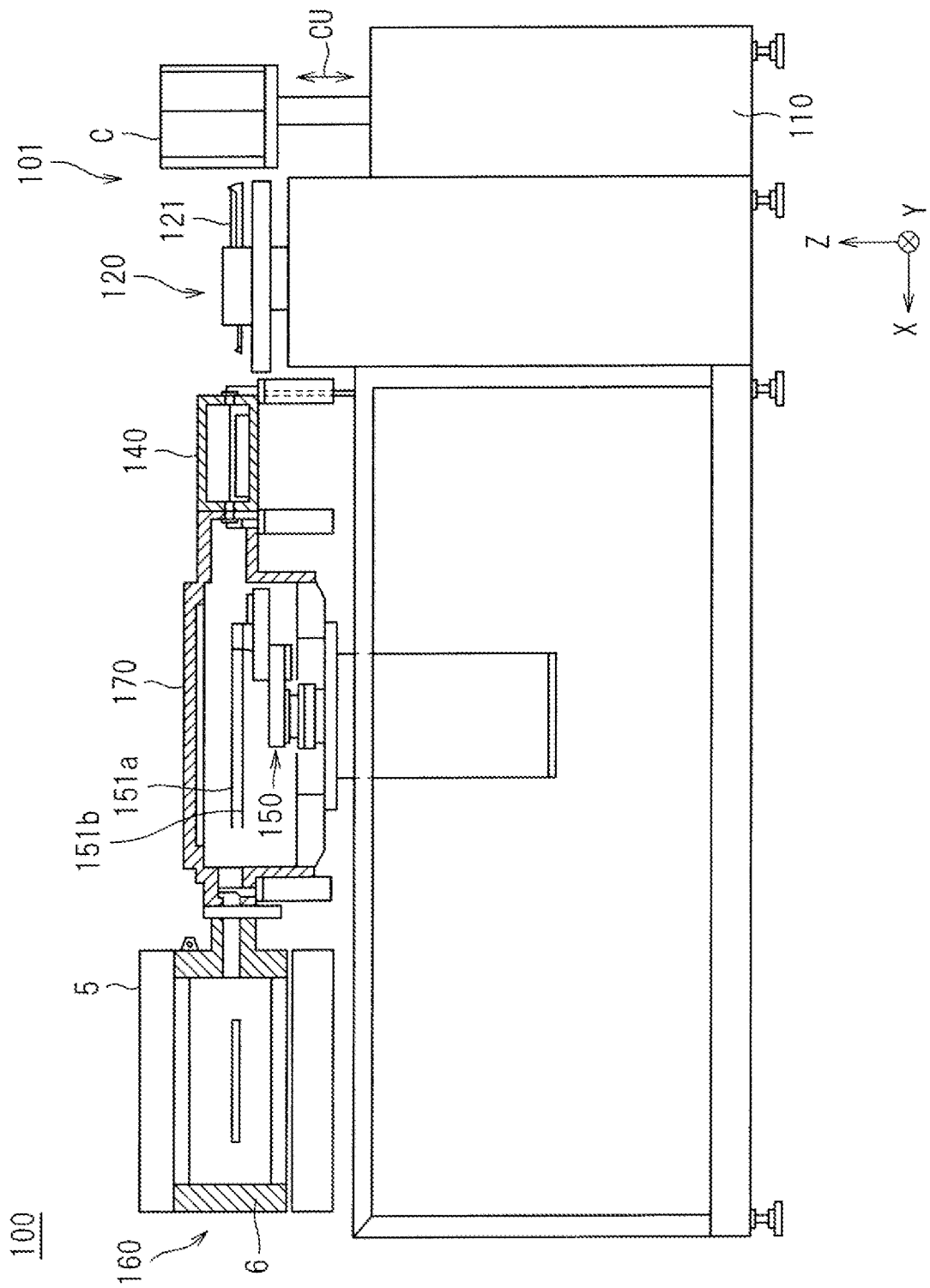
FIG. 2 is a front view schematically showing an example of a configuration of the heat treatment system according to the embodiment.

As shown in FIGS. 1 and 2, the heat treatment system 100 includes: an indexer unit 101 for loading an untreated semiconductor wafer W into the apparatus from the outside and unloading the treated semiconductor wafer W from the apparatus, an alignment unit 230 for positioning the untreated semiconductor wafer W, two cooling units 130 and 140 for cooling the semiconductor wafer W after the heating treatment, a heat treatment apparatus 160 for performing the flash heating treatment on the semiconductor wafer W, and a conveyance robot 150 for delivering the semiconductor wafer W to and from the cooling unit 130, the cooling unit 140, and the heat treatment apparatus 160.

In addition, the heat treatment system 100 includes a control unit 3 that controls the operating mechanisms provided in each of the above-described treatment units, and the conveyance robot 150, and proceeds the flash heating treatment of the semiconductor wafer W.

The indexer unit 101 includes: a load port 110 for placing a plurality of carriers C (two in the present embodiment) side by side, and a delivery robot 120 for taking out an untreated semiconductor wafer W from each carrier C and storing the treated semiconductor wafer W in each carrier C.

The carrier C that houses the untreated semiconductor wafer W is conveyed by an automated guided vehicle (AGV, OHT) or the like and placed on the load port 110, and the carrier C that houses the treated semiconductor wafer W is carried away from the load port 110 by the automated guided vehicle.

In addition, in the load port 110, the carrier C is configured to be movable up and down as indicated by an arrow CU in FIG. 2 so that the delivery robot 120 can take in and out any semiconductor wafer W with respect to the carrier C.

It should be noted that the form of the carrier C may be a standard mechanical interface (SMIF) pod or an open cassette (OC) that exposes the stored semiconductor wafer W to the outside air, in addition to the front opening unified pod (FOUP) that stores the semiconductor wafer W in a sealed space.

In addition, the delivery robot 120 can slide and move as indicated by an arrow 120S in FIG. 1, and can turn and move up and down as indicated by an arrow 120R. Thus, the delivery robot 120 takes in and out the semiconductor wafer W with respect to the two carriers C, and delivers the semiconductor wafer W to and from the alignment unit 230 and the two cooling units 130 and 140.

Taking in and out the semiconductor wafer W with respect to the carrier C by the delivery robot 120 is performed by sliding movement of the hand 121 and up-and-down movement of the carrier C. In addition, the delivery of the semiconductor wafer W between the delivery robot 120 and the alignment unit 230 or the cooling unit 130 (cooling unit 140) is performed by the sliding movement of the hand 121 and the up-and-down operation of the delivery robot 120.

The alignment unit 230 is provided to be connected to a side of the indexer unit 101 along the Y-axis direction. The alignment unit 230 is a treatment unit that rotates the semiconductor wafer W in a horizontal plane to direct the semiconductor wafer W in a direction suitable for flash heating. The alignment unit 230 is configured by providing a mechanism for supporting and rotating the semiconductor wafer W in a horizontal attitude, a mechanism for optically detecting a notch or an orientation flat formed in a peripheral portion of the semiconductor wafer W, and the like, inside an alignment chamber 231 being a housing made of an aluminum alloy.

The delivery of the semiconductor wafer W to the alignment unit 230 is performed by the delivery robot 120. The semiconductor wafer W is delivered from the delivery robot 120 to the alignment chamber 231 so that the wafer center is positioned at a predetermined position.

In the alignment unit 230, the semiconductor wafer W is rotated around the vertical axis with the center portion of the semiconductor wafer W received from the indexer unit 101 as the rotation center, and optically detecting the notch or the like adjusts the orientation of the semiconductor wafer W. The semiconductor wafer W whose orientation adjustment has been completed is taken out from the alignment chamber 231 by the delivery robot 120.

A conveyance chamber 170 for housing the conveyance robot 150 is provided as a conveyance space for the semiconductor wafer W by the conveyance robot 150. A chamber 6 of the heat treatment apparatus 160, a first cooling chamber 131 of the cooling unit 130, and a second cooling chamber 141 of the cooling unit 140 are connected in communication with three sides of the conveyance chamber 170.

The heat treatment apparatus 160 being a main part of the heat treatment system 100 is a substrate treatment unit that irradiates the preheated (assisted heating) semiconductor wafer W with a flash (flash of light) from the xenon flash lamps FL to perform flash heating treatment. The configuration of the heat treatment apparatus 160 will be further described below.

The two cooling units 130 and 140 have substantially the same configuration. Each of the cooling unit 130 and the cooling unit 140 includes a cooling plate made of metal and a quartz plate placed on the upper surface thereof (none of them are shown) inside the first cooling chamber 131 or the second cooling chamber 141 being a housing made of an aluminum alloy. The temperature of the cooling plate is adjusted to room temperature (about 23° C.) by a Peltier element or constant temperature water circulation.

The semiconductor wafer W on which the flash heating treatment is performed in the heat treatment apparatus 160 is loaded into the first cooling chamber 131 or the second cooling chamber 141, placed on the quartz plate, and cooled.

Both the first cooling chamber 131 and the second cooling chamber 141 are disposed between the indexer unit 101 and the conveyance chamber 170 and connected to both of them.

The first cooling chamber 131 and the second cooling chamber 141 are provided with two openings for loading and unloading the semiconductor wafer W. Of the two openings of the first cooling chamber 131, the opening connected to the indexer unit 101 can be opened and closed by a gate valve 181.

On the other hand, an opening connected to the conveyance chamber 170 of the first cooling chamber 131 can be opened and closed by a gate valve 183. That is, the first cooling chamber 131 and the indexer unit 101 are connected to each other through the gate valve 181, and the first cooling chamber 131 and the conveyance chamber 170 are connected to each other through the gate valve 183.

When the semiconductor wafer W is delivered between the indexer unit 101 and the first cooling chamber 131, the gate valve 181 is opened. In addition, when the semiconductor wafer W is delivered between the first cooling chamber 131 and the conveyance chamber 170, the gate valve 183 is opened. When the gate valve 181 and the gate valve 183 are closed, the inside of the first cooling chamber 131 is a hermetically sealed space.

In addition, of the two openings of the second cooling chamber 141, the opening connected to the indexer unit 101 can be opened and closed by a gate valve 182. On the other hand, an opening connected to the conveyance chamber 170 of the second cooling chamber 141 can be opened and closed by a gate valve 184. That is, the second cooling chamber 141 and the indexer unit 101 are connected to each other through the gate valve 182, and the second cooling chamber 141 and the conveyance chamber 170 are connected to each other through the gate valve 184.

When the semiconductor wafer W is delivered between the indexer unit 101 and the second cooling chamber 141, the gate valve 182 is opened. In addition, when the semiconductor wafer W is delivered between the second cooling chamber 141 and the conveyance chamber 170, the gate valve 184 is opened. When the gate valve 182 and the gate valve 184 are closed, the inside of the second cooling chamber 141 is a hermetically sealed space.

The conveyance robot 150 provided in the conveyance chamber 170 installed adjacent to the chamber 6 can turn about an axis along the vertical direction as indicated by an arrow 150R. The conveyance robot 150 has two link mechanisms including a plurality of arm segments, and each of the tips of the two link mechanisms is provided with a conveyance hand 151*a* and a conveyance hand 151*b* for holding the semiconductor wafer W. These conveyance hand 151*a* and the conveyance hand 151*b* are vertically arranged apart at a predetermined pitch, and are linearly slidable and movable in the same horizontal direction independently of each other by the link mechanisms.

In addition, the conveyance robot 150 moves up and down the base provided with the two link mechanisms to move up and down the two conveyance hands 151*a* and 151*b* left to be separated by the predetermined pitch.

When the conveyance robot 150 delivers (takes in and out) the semiconductor wafer W with the first cooling chamber 131, the second cooling chamber 141, or the chamber 6 of the heat treatment apparatus 160 as a delivery party, first, both the conveyance hand 151*a* and the conveyance hand 151*b* are turned so as to face the delivery party, and then (or while being turned) are moved up and down to be positioned at a height at which any one of the conveyance hands delivers the semiconductor wafer W to and from the delivery party. Then, the conveyance hand 151*a* (151*b*) is linearly slid and moved in the horizontal direction to deliver the semiconductor wafer W to and from the delivery party.

The delivery of the semiconductor wafer W between the conveyance robot 150 and the delivery robot 120 can be performed through the cooling unit 130 and the cooling unit 140. That is, the first cooling chamber 131 of the cooling unit 130 and the second cooling chamber 141 of the cooling unit 140 also function as a path for delivering the semiconductor wafer W between the conveyance robot 150 and the delivery robot 120. Specifically, delivery of the semiconductor wafer W is performed when one of the conveyance robot 150 and the delivery robot 120 receives a semiconductor wafer W transferred to the first cooling chamber 131 or the second cooling chamber 141 by the other thereof. The conveyance robot 150 and the delivery robot 120 constitute a conveyance mechanism that conveys the semiconductor wafer W from the carrier C to the heat treatment apparatus 160.

As described above, the gate valve 181 and the gate valve 182 are respectively provided between the first cooling chamber 131 and the indexer unit 101 and between the second cooling chamber 141 and the indexer unit 101. In addition, the gate valve 183 and the gate valve 184 are respectively provided between the conveyance chamber 170 and the first cooling chamber 131 and between the conveyance chamber 170 and the second cooling chamber 141. Furthermore, a gate valve 185 is provided between the conveyance chamber 170 and the chamber 6 of the heat treatment apparatus 160. When the semiconductor wafer W is conveyed in the heat treatment system 100, these gate valves are appropriately opened and closed.

Figure 3:
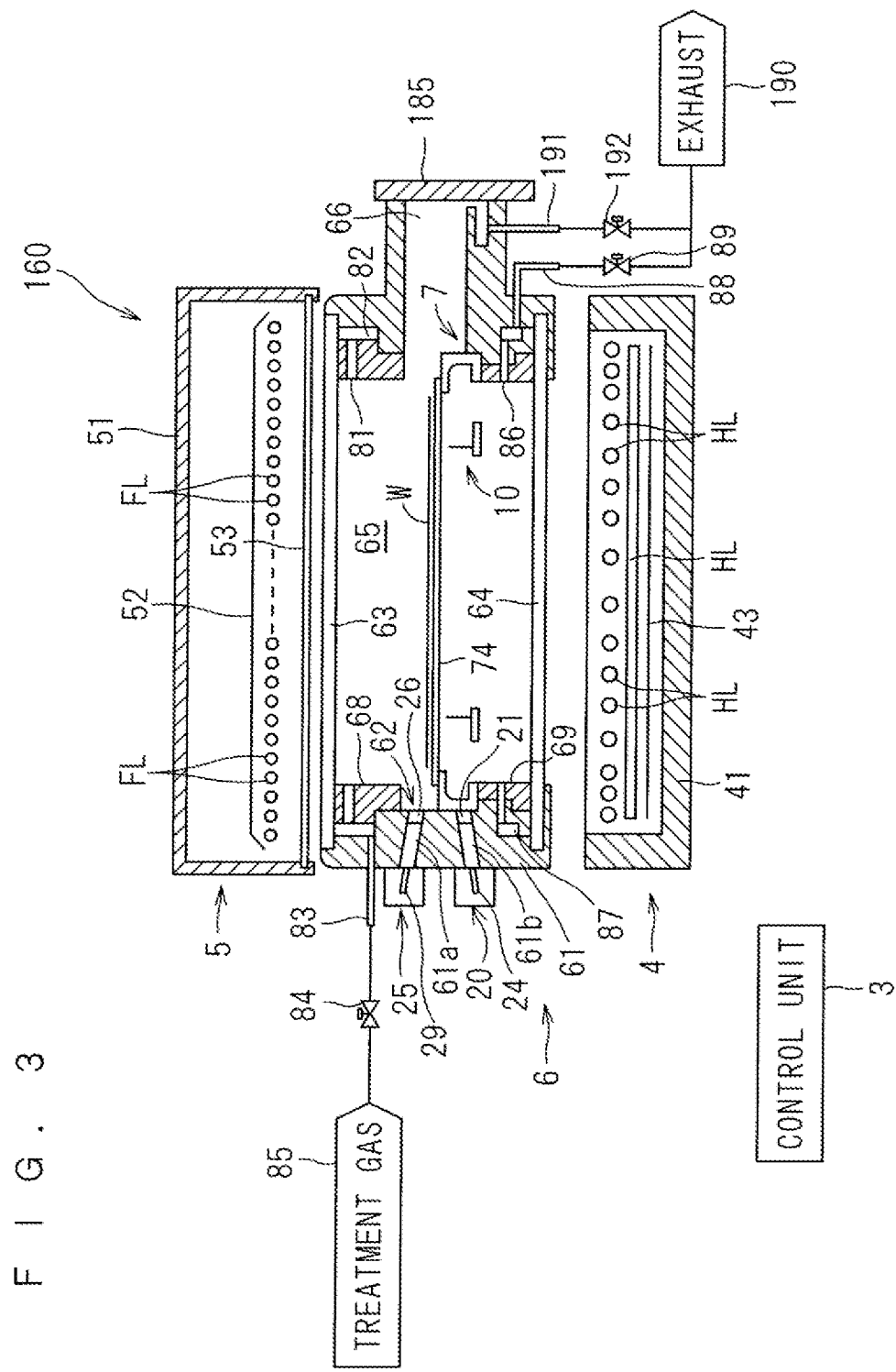
FIG. 3 is a cross-sectional view schematically showing a configuration of the heat treatment apparatus in the heat treatment system according to the embodiment.

FIG. 3 is a cross-sectional view schematically showing a configuration of the heat treatment apparatus 160 in the heat treatment system 100 according to the present embodiment.

As shown in FIG. 3 as an example, the heat treatment apparatus 160 is a flash lamp annealing apparatus that irradiates a disc-shaped semiconductor wafer W as a substrate with a flash of light to heat the semiconductor wafer W.

The size of the semiconductor wafer W to be treated is not particularly limited, and is, for example, φ 300 mm or φ 450 mm (φ 300 mm in the present embodiment).

The heat treatment apparatus 160 includes a chamber 6 for housing a semiconductor wafer W, a flash heating unit 5 incorporating a plurality of flash lamps FL, and a halogen heating unit 4 incorporating a plurality of halogen lamps HL. The flash heating unit 5 is provided above the chamber 6, and the halogen heating unit 4 is provided below the chamber 6.

In addition, the heat treatment apparatus 160 includes, inside the chamber 6, a holding unit 7 for holding a semiconductor wafer W in a horizontal attitude, and a transfer mechanism 10 for delivering a semiconductor wafer W between the holding unit 7 and the outside of the heat treatment apparatus.

Furthermore, the heat treatment apparatus 160 includes a control unit 3 for controlling respective operating mechanisms provided in the halogen heating unit 4, the flash heating unit 5, and the chamber 6 to cause the operating mechanisms to perform heat treatment on a semiconductor wafer W.

The chamber 6 is configured by mounting quartz chamber windows above and below the cylindrical chamber side portion 61. The chamber side portion 61 has a substantially cylindrical shape with upper and lower openings, the upper opening is mounted and blocked with an upper chamber window 63, and the lower opening is mounted and blocked with a lower chamber window 64.

The upper chamber window 63 forming the ceiling portion of the chamber 6 is a disc-shaped member made of quartz, and functions as a quartz window that transmits a flash of light emitted from the flash heating unit 5 into the chamber 6.

In addition, the lower chamber window 64 forming the floor portion of the chamber 6 is also a disc-shaped member made of quartz, and functions as a quartz window that transmits light from the halogen heating unit 4 into the chamber 6.

In addition, a reflective ring 68 is mounted on an upper portion of the inner wall surface of the chamber side portion 61, and a reflective ring 69 is mounted on a lower portion thereof. Both reflective rings 68 and 69 are annularly formed.

The upper reflective ring 68 is mounted by being fitted from the upper side of the chamber side portion 61. On the other hand, the lower reflective ring 69 is mounted by being fitted from the lower side of the chamber side portion 61 and is fastened with screws (not shown). That is, both reflective rings 68 and 69 are detachably mounted on the chamber side portion 61.

An inner space of the chamber 6, that is, a space surrounded by the upper chamber window 63, the lower chamber window 64, the chamber side portion 61, and the reflective rings 68 and 69 is defined as a heat treatment space 65.

Mounting the reflective rings 68 and 69 on the chamber side portion 61 forms a recessed portion 62 on the inner wall surface of the chamber 6. That is, on the inner wall surface of the chamber side portion 61, a recessed portion 62 surrounded by a middle portion where the reflective rings 68 and 69 are not mounted, a lower end surface of the reflective ring 68, and an upper end surface of the reflective ring 69 is formed.

The recessed portion 62 is annularly formed along the horizontal direction on the inner wall surface of the chamber 6, and surrounds the holding unit 7 for holding a semiconductor wafer W. The chamber side portion 61 and the reflective rings 68 and 69 are made of a metal material excellent in strength and heat resistance (such as stainless steel).

In addition, the chamber side portion 61 is provided with a conveyance opening (throat) 66 for loading and unloading a semiconductor wafer W into and from the chamber 6. The conveyance opening 66 can be opened and closed by the gate valve 185. The conveyance opening 66 is connected in communication with an outer peripheral surface of the recessed portion 62.

Therefore, when the gate valve 185 opens the conveyance opening 66, it is possible to load a semiconductor wafer W from the conveyance opening 66 through the recessed portion 62 into the heat treatment space 65 and to unload a semiconductor wafer W from the heat treatment space 65. In addition, when the gate valve 185 closes the conveyance opening 66, the heat treatment space 65 inside the chamber 6 becomes a hermetically sealed space.

Furthermore, a through hole 61a and a through hole 61b are drilled in the chamber side portion 61. The through hole 61a is a cylindrical hole for guiding the infrared light radiated from the upper surface of the semiconductor wafer W held by a susceptor 74 described below to the quantum infrared sensor 29 of the upper radiation thermometer 25. On the other hand, the through hole 61b is a cylindrical hole for guiding infrared light radiated from the lower surface of a semiconductor wafer W to the thermal infrared sensor 24 of the lower radiation thermometer 20. The through hole 61a and the through hole 61b are provided to be inclined with respect to the horizontal direction so that their axes in the through direction intersect with the main surface of the semiconductor wafer W held by the susceptor 74.

The quantum infrared sensor 29 is an element that directly converts photon energy of infrared rays into an electric signal by a photoelectric conversion effect. The quantum infrared sensor 29 is, for example, a photoconductive InSb sensor having a sensitivity wavelength of 3 to 5 μm, but may be another quantum infrared sensor (impurity type infrared sensor, photovoltaic type infrared sensor, or the like).

The thermal infrared sensor 24 is an element that converts energy of absorbed infrared rays into heat and detects a change in the heat as a signal. The thermal infrared sensor 24 is, for example, a pyroelectric sensor using a pyroelectric effect, a thermopile using a Seebeck effect, or a bolometer using a resistance change of a semiconductor due to heat. In addition, the infrared sensor used in the lower radiation thermometer 20 may be replaced with a quantum infrared sensor.

A transparent window 26 made of a calcium fluoride material that transmits infrared light in a wavelength range measurable by the upper radiation thermometer 25 is attached to the end portion on the side facing the heat treatment space 65 of the through hole 61a. In addition, a transparent window 21 made of a barium fluoride material that transmits infrared light in a wavelength range measurable by the lower radiation thermometer 20 is attached to the end portion on the side facing the heat treatment space 65 of the through hole 61b.

In addition, the upper portion of the inner wall of the chamber 6 is provided with a gas supply hole 81 for supplying the treatment gas to the heat treatment space 65. The gas supply hole 81 is provided at a position above the recessed portion 62, and may be provided in the reflective ring 68. The gas supply hole 81 is connected in communication with the gas supply tube 83 through a buffer space 82 annularly formed inside the side wall of the chamber 6.

The gas supply tube 83 is connected to the treatment gas supply source 85. In addition, a valve 84 is inserted halfway through the path of the gas supply tube 83. When the valve 84 is opened, the treatment gas is supplied from the treatment gas supply source 85 to the buffer space 82.

The treatment gas flowing in the buffer space 82 flows in a spreading manner within the buffer space 82 lower in fluid resistance than the gas supply hole 81, and is supplied from the gas supply hole 81 into the heat treatment space 65. As the treatment gas, for example, an inert gas such as nitrogen ($N_2$), a reactive gas such as hydrogen ($H_2$) or ammonia ($NH_3$), or a mixed gas in which they are mixed can be used (nitrogen gas in the present embodiment).

On the other hand, a gas exhaust hole 86 for exhausting the gas in the heat treatment space 65 is provided in the lower portion of the inner wall of the chamber 6. The gas exhaust hole 86 is provided at a position below the recessed portion 62, and may be provided in the reflective ring 69. The gas exhaust hole 86 is connected in communication with a gas exhaust tube 88 through a buffer space 87 annularly formed inside the side wall of the chamber 6. The gas exhaust tube 88 is connected to an exhaust unit 190. In addition, a valve 89 is inserted halfway through the path of the gas exhaust tube 88. When the valve 89 is opened, the gas in the heat treatment space 65 is discharged from the gas exhaust hole 86 through the buffer space 87 to the gas exhaust tube 88.

It should be noted that a plurality of gas supply holes 81 and gas exhaust holes 86 may be provided along the circumferential direction of the chamber 6, or may be slit-shaped. In addition, the treatment gas supply source 85 and the exhaust unit 190 may be mechanisms provided in the heat treatment apparatus 160, or may be utilities of a factory in which the heat treatment apparatus 160 is installed.

In addition, a gas exhaust tube 191 for discharging the gas in the heat treatment space 65 is also connected to the tip of the conveyance opening 66. The gas exhaust tube 191 is connected to the exhaust unit 190 through a valve 192. Opening the valve 192 exhausts the gas in the chamber 6 through the conveyance opening 66.

Figure 4:
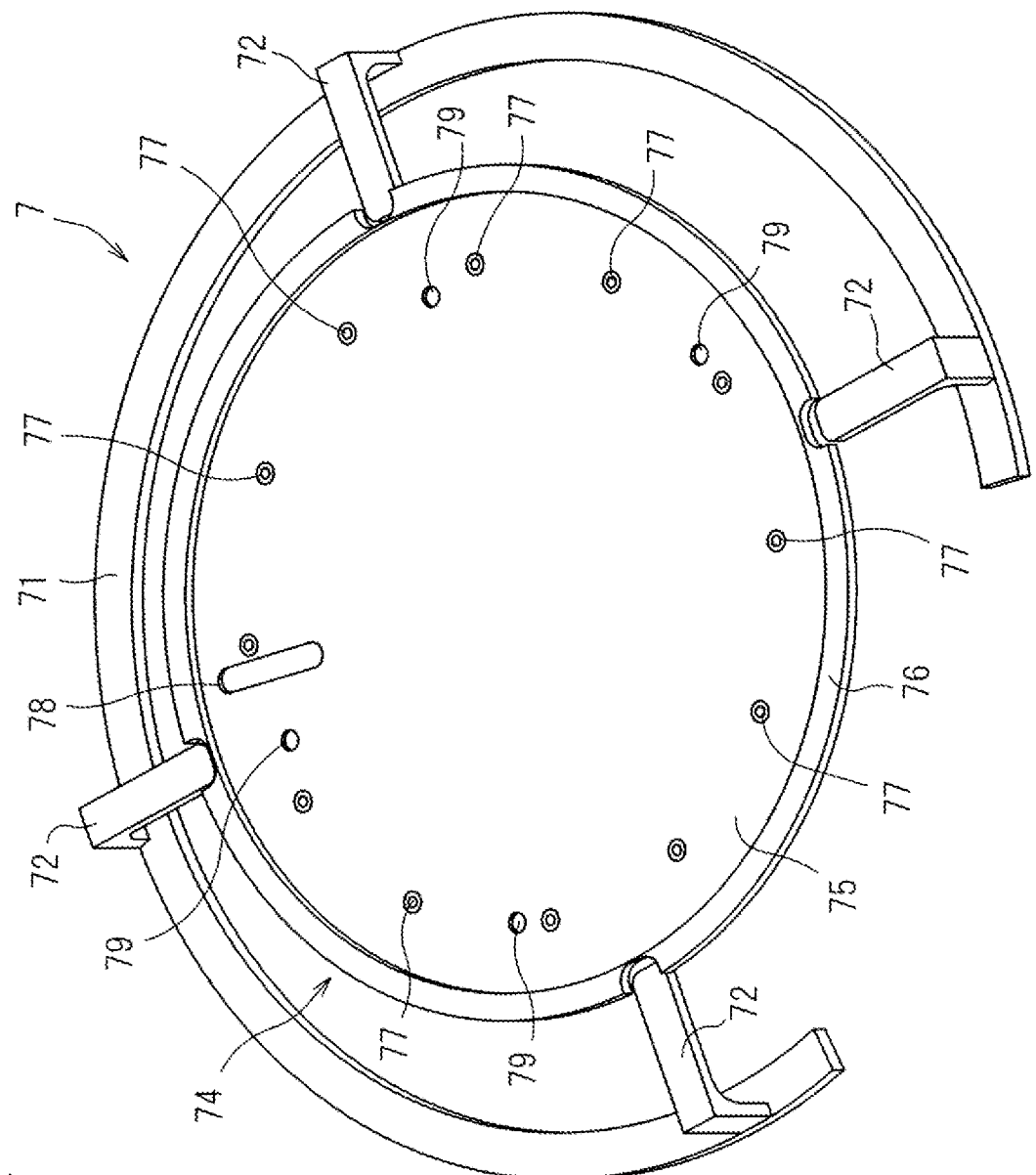
FIG. 4 is a perspective view showing an overall appearance of a holding unit.

FIG. 4 is a perspective view showing the overall appearance of the holding unit 7. The holding unit 7 includes a base ring 71, coupling portions 72, and the susceptor 74. The base ring 71, the coupling portion 72, and the susceptor 74 are all made of quartz. That is, the entire holding unit 7 is made of quartz.

The base ring 71 is an arc-shaped quartz member in which a part is missing from the annular shape. This missing portion is provided to prevent interference between the transfer arm 11 of the transfer mechanism 10 described below and the base ring 71. Placing the base ring 71 on the bottom surface of the recessed portion 62 causes the base ring 71 to be supported on the wall surface of the chamber 6 (see FIG. 3). On the upper surface of the base ring 71, a plurality of coupling portions 72 (four in the present embodiment) are erected along the circumferential direction of the annular shape thereof. The coupling portion 72 is also a quartz member, and is fixed to the base ring 71 by welding.

The susceptor 74 is supported by the four coupling portions 72 provided on the base ring 71. FIG. 5 is a plan view of the susceptor 74. In addition, FIG. 6 is a cross-sectional view of the susceptor 74.

The susceptor 74 includes a holding plate 75, a guide ring 76, and a plurality of substrate support pins 77. The holding plate 75 is a substantially circular flat plate-shaped member made of quartz. The diameter of the holding plate 75 is greater than the diameter of a semiconductor wafer W. That is, the holding plate 75 has a larger planar size than the semiconductor wafer W.

The guide ring 76 is installed on the upper surface circumferential edge portion of the holding plate 75. The guide ring 76 is an annular-shaped member having an inner diameter larger than the diameter of the semiconductor wafer W. For example, when the diameter of the semiconductor wafer W is φ 300 mm, the inner diameter of the guide ring 76 is φ 320 mm.

The inner circumference of the guide ring 76 is a tapered surface so as to widen upward from the holding plate 75. The guide ring 76 is made of quartz similar to the holding plate 75.

The guide ring 76 may be welded to the upper surface of the holding plate 75 or fixed to the holding plate 75 with separately machined pins and the like. Alternatively, the holding plate 75 and the guide ring 76 may be machined as an integral member.

On the upper surface of the holding plate 75, the region inside the guide ring 76 serves as a flat holding surface 75a for holding the semiconductor wafer W. A plurality of substrate support pins 77 are erected on the holding surface 75a of the holding plate 75. In the present embodiment, a total of twelve substrate support pins 77 are erected at every 30° along the circumference of the circle concentric with the outer circumference circle (inner circumference circle of the guide ring 76) of the holding surface 75a.

The diameter of the circle in which the twelve substrate support pins 77 are arranged (distance between the opposing substrate support pins 77) is smaller than the diameter of the semiconductor wafer W, and is φ 270 mm to φ 280 mm (φ270 mm in the present embodiment) when the diameter of the semiconductor wafer W is φ 300 mm. Each of the substrate support pins 77 is made of quartz.

The plurality of substrate support pins 77 may be provided on the upper surface of the holding plate 75 by welding, or may be machined integrally with the holding plate 75.

Returning to FIG. 4, the four coupling portions 72 erected on the base ring 71 and the circumferential edge portion of the holding plate 75 of the susceptor 74 are fixed by welding. That is, the susceptor 74 and the base ring 71 are fixedly coupled by the coupling portion 72. The base ring 71 of the holding unit 7 is supported on the wall surface of the chamber 6, whereby the holding unit 7 is mounted on the chamber 6. In a state where the holding unit 7 is mounted on the chamber 6, the holding plate 75 of the susceptor 74 is in a horizontal attitude (attitude in which the normal line coincides with the vertical direction). That is, the holding surface 75a of the holding plate 75 is a horizontal plane.

The semiconductor wafer W loaded into the chamber 6 is placed and held in a horizontal attitude on the susceptor 74 of the holding unit 7 mounted on the chamber 6. At this time, the semiconductor wafer W is supported by the twelve substrate support pins 77 erected on the holding plate 75 and is held by the susceptor 74. More precisely, the upper end portions of the twelve substrate support pins 77 come into contact with the lower surface of the semiconductor wafer W to support the semiconductor wafer W.

Since the heights of the twelve substrate support pins 77 (distances from the upper ends of the substrate support pins 77 to the holding surface 75a of the holding plate 75) are uniform, the semiconductor wafer W can be supported in a horizontal attitude by the twelve substrate support pins 77.

In addition, the semiconductor wafer W is supported by a plurality of substrate support pins 77 at a predetermined distance from the holding surface 75a of the holding plate 75. The thickness of the guide ring 76 is larger than the height of the substrate support pin 77. Therefore, the horizontal positional deviation of the semiconductor wafer W supported by the plurality of substrate support pins 77 is prevented by the guide ring 76.

In addition, as shown in FIGS. 4 and 5, in the holding plate 75 of the susceptor 74, an opening 78 vertically penetrating is formed. The opening 78 is provided in order for the lower radiation thermometer 20 to receive the radiation light (infrared light) radiated from the lower surface of the semiconductor wafer W. That is, the lower radiation thermometer 20 receives the light radiated from the lower surface of the semiconductor wafer W through the opening 78 and the transparent window 21 mounted on the through hole 61b of the chamber side portion 61, and measures the temperature of the semiconductor wafer W.

Furthermore, in the holding plate 75 of the susceptor 74, four through holes 79 through which the lift pins 12 of the transfer mechanism 10 described below pass are drilled for the delivery of the semiconductor wafer W.

Figure 7:
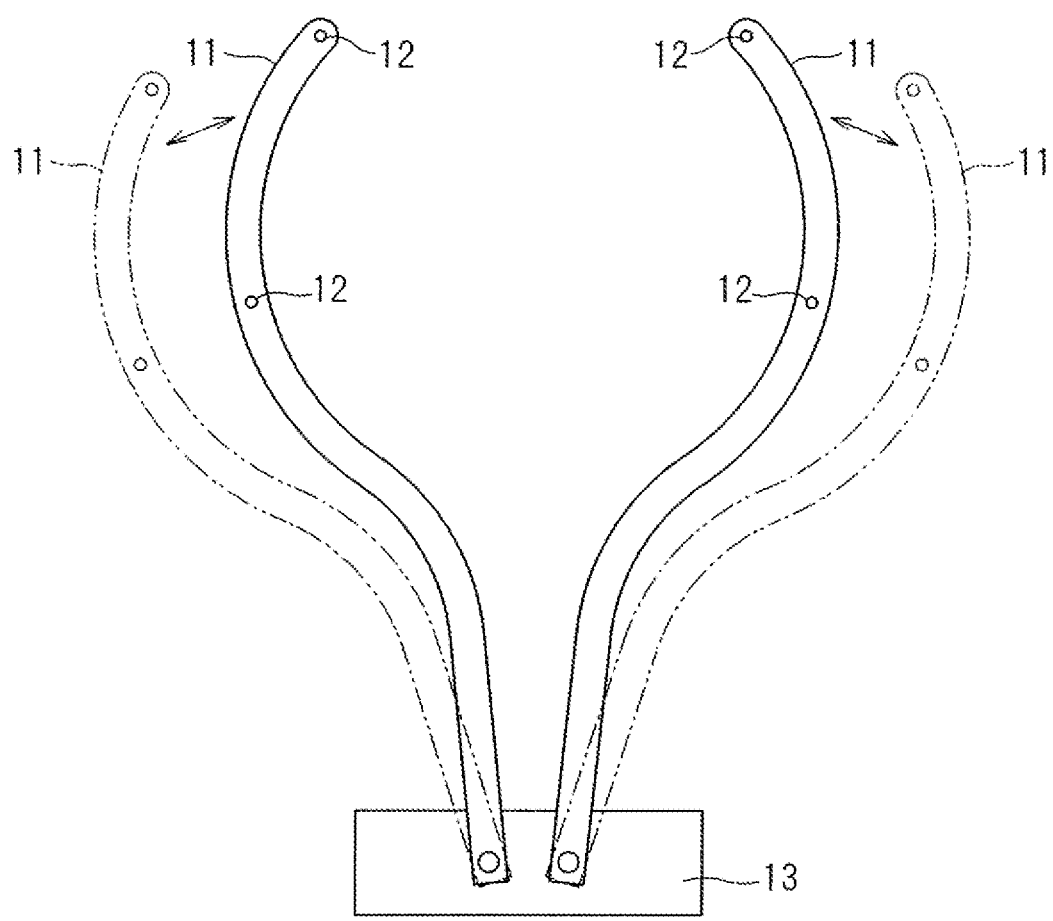
FIG. 7 is a plan view of a transfer mechanism.
Figure 8:
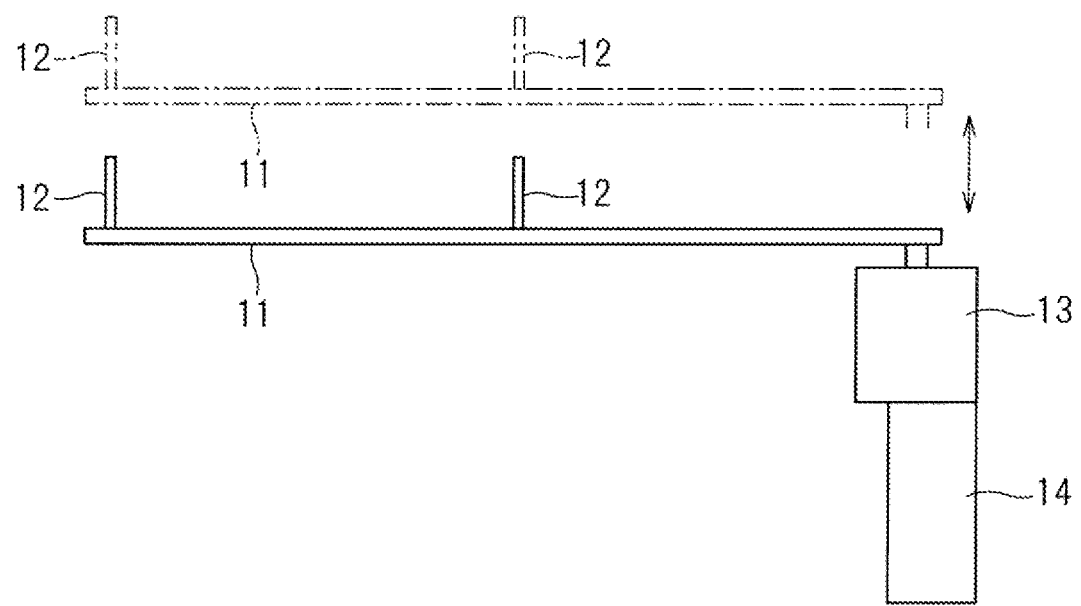
FIG. 8 is a side view of the transfer mechanism.

FIG. 7 is a plan view of the transfer mechanism 10. In addition, FIG. 8 is a side view of the transfer mechanism 10. The transfer mechanism 10 includes two transfer arms 11. The transfer arm 11 has an arc shape that approximately follows the annular recessed portion 62.

Two lift pins 12 are erected on each transfer arm 11. The transfer arm 11 and the lift pin 12 are made of quartz. Each transfer arm 11 is rotatable by a horizontal movement mechanism 13. The horizontal movement mechanism 13 horizontally moves a pair of transfer arms 11 between the transfer operation position (solid line position in FIG. 7) that transfers the semiconductor wafer W with respect to the holding unit 7 and the retracted position (two-dot chain line position in FIG. 7) that does not overlap with the semiconductor wafer W held by the holding unit 7 in a plan view.

The horizontal movement mechanism 13 may be a mechanism that causes separate motors to rotate the respective transfer arms 11, or may be a mechanism that causes a single motor to rotate the pair of transfer arms 11 in an interlocked manner using a link mechanism.

In addition, the pair of transfer arms 11 are moved up and down together with the horizontal movement mechanism 13 by an elevating mechanism 14. When the elevating mechanism 14 raises the pair of transfer arms 11 at the transfer operation position, a total of four lift pins 12 pass through the through holes 79 (see FIGS. 4 and 5) drilled in the susceptor 74, and the upper end of the lift pin 12 protrudes from the upper surface of the susceptor 74. On the other hand, when the elevating mechanism 14 lowers the pair of transfer arms 11 at the transfer operation position to pull out the lift pins 12 from the through holes 79, and the horizontal movement mechanism 13 moves the pair of transfer arms 11 so as to open the pair of transfer arms 11, each transfer arm 11 moves to the retracted position.

The retracted position of the pair of transfer arms 11 is directly above the base ring 71 of the holding unit 7. Since the base ring 71 is placed on the bottom surface of the recessed portion 62, the retracted position of the transfer arms 11 is inside the recessed portion 62. It should be noted that an exhaust mechanism (not shown) is also provided near the portion where the driving unit (horizontal movement mechanism 13 and elevating mechanism 14) of the transfer mechanism 10 is provided, and is configured so that the atmosphere around the driving unit of the transfer mechanism 10 is discharged to the outside of the chamber 6.

Returning to FIG. 3, the flash heating unit 5 provided above the chamber 6 is configured to include, inside the housing 51, a light source including a plurality of (30 in the present embodiment) flash lamps FL, and a reflector 52 provided to cover above the light source.

In addition, a lamp light radiation window 53 is mounted on the bottom portion of the housing 51 of the flash heating unit 5. The lamp light radiation window 53 constituting the floor portion of the flash heating unit 5 is a plate-shaped quartz window made of quartz. Installing the flash heating unit 5 above the chamber 6 causes the lamp light radiation window 53 and the upper chamber window 63 to face each other.

The flash lamps FL apply a flash of light from above the chamber 6 through the lamp light radiation window 53 and the upper chamber window 63 to the heat treatment space 65.

The plurality of flash lamps FL are each a rod-shaped lamp having an elongated cylindrical shape and are arranged in a planar shape so that the longitudinal directions of the respective flash lamps FL are in parallel with each other along a main surface of a semiconductor wafer W held by the holding unit 7 (that is, along a horizontal direction). Therefore, the plane formed by the arrangement of the flash lamps FL is also a horizontal plane.

The flash lamp FL includes a rod-shaped glass tube (discharge tube) which seals xenon gas inside, and at both end portions of which an anode and a cathode connected to capacitors are arranged, and a trigger electrode attached on the outer circumferential surface of the glass tube.

Since xenon gas is electrically an insulator, electricity does not flow in the glass tube under normal conditions even if electric charges are accumulated in the capacitor. However, when a high voltage is applied to the trigger electrode to break the insulation, electric charges stored in the capacitor flow instantly in the glass tube, and light is emitted by the excitation of xenon atoms or molecules at that time.

In this flash lamp FL, the electrostatic energy stored in the capacitor in advance is converted into an extremely short optical pulse of 0.1 ms to 100 ms, so that the flash lamp FL has the feature that it can apply extremely strong light as compared with a continuously lit light source such as the halogen lamp HL. That is, the flash lamp FL is a pulse light emitting lamp that emits light instantaneously in an extremely short time of less than 1 second. It should be noted that the light emitting time of the flash lamp FL can be adjusted by the coil constant of the lamp power supply that supplies power to the flash lamp FL.

It should be noted that the electrostatic energy serving as the light emission intensity of the flash lamp FL can be changed by the charging voltage stored in the capacitor. In addition, the light emission time of the flash lamp FL can be changed by setting a pulse waveform.

In addition, the reflector 52 is provided above the plurality of flash lamps FL so as to cover all of them. The basic function of the reflector 52 is to reflect the flashes of light emitted from the plurality of flash lamps FL toward the heat treatment space 65. The reflector 52 is made of an aluminum alloy plate, and its front-surface (surface on the side facing the flash lamps FL, that is, upper surface) is roughened by blasting.

The halogen heating unit 4 provided below the chamber 6 incorporates a plurality of halogen lamps HL (40 in the present embodiment) inside the housing 41. The halogen heating unit 4 causes a plurality of halogen lamps HL to apply light from below the chamber 6 through the lower chamber window 64 to the heat treatment space 65 to heat the semiconductor wafer W.

Figure 9:
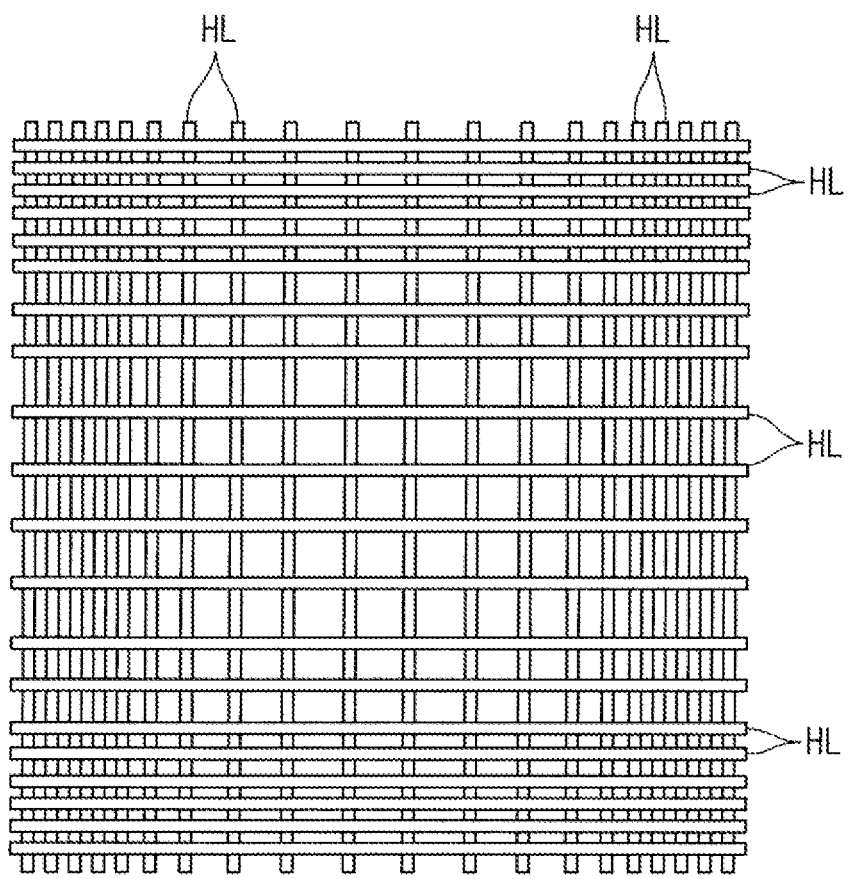
FIG. 9 is a plan view showing an arrangement of a plurality of halogen lamps.

FIG. 9 is a plan view showing an arrangement of the plurality of halogen lamps HL. The 40 halogen lamps HL are arranged to be divided into two stages of upper and lower stages. Twenty halogen lamps HL are arranged in the upper stage near the holding unit 7, and twenty halogen lamps HL are arranged also in the lower stage farther from the holding unit 7 than the upper stage.

Each halogen lamp HL is a rod-shaped lamp having a long cylindrical shape. In both the upper and lower stages, 20 halogen lamps HL are arranged so that the respective longitudinal directions are parallel to each other along the main surface of the semiconductor wafer W held by the holding unit 7 (that is, along the horizontal direction). Therefore, the plane formed by the arrangement of the halogen lamps HL in both the upper and lower stages is a horizontal plane.

In addition, as shown in FIG. 9, in both the upper and lower stages, the arrangement density of the halogen lamps HL in the region facing the circumferential edge portion is higher than that in the region facing the central portion of the semiconductor wafer W held by the holding unit 7. That is, in both the upper and lower stages, the arrangement pitch of the halogen lamps HL is shorter in the circumferential edge portion than in the central portion of the lamp arrangement. Therefore, it is possible to apply a larger amount of light to the circumferential edge portion of the semiconductor wafer W likely to have a temperature drop during heating by light irradiation from the halogen heating unit 4.

In addition, the lamp group including the halogen lamps HL in the upper stage and the lamp group including the halogen lamps HL in the lower stage are arranged to intersect in a grid pattern. That is, a total of 40 halogen lamps HL are arranged so that the longitudinal direction of the 20 halogen lamps HL arranged in the upper stage and the longitudinal direction of the 20 halogen lamps HL arranged in the lower stage are orthogonal to each other.

The halogen lamp HL is a filament type light source that incandesces the filament and emits light by energizing the filament arranged inside the glass tube. Inside the glass tube, a gas in which a minute amount of a halogen element (iodine, bromine, or the like) is introduced into an inert gas such as nitrogen or argon is sealed. Introducing the halogen element makes it possible to set the temperature of the filament to a high temperature while suppressing the breakage of the filament.

Therefore, the halogen lamp HL has a characteristic of having a longer life and allowing continuous irradiation with strong light as compared with a normal incandescent lamp. That is, the halogen lamp HL is a continuously lit lamp that continuously emits light for at least 1 second or longer. In addition, since the halogen lamp HL is a rod-shaped lamp, it has a long life, and arranging the halogen lamp HL along the horizontal direction causes the radiation efficiency to the semiconductor wafer W arranged above to become excellent.

In addition, also inside the housing 41 of the halogen heating unit 4, a reflector 43 is provided below the two-stage halogen lamps HL (FIG. 3). The reflector 43 reflects the light emitted from the plurality of halogen lamps HL toward the heat treatment space 65.

As shown in FIG. 3, the chamber 6 is provided with two radiation thermometers (pyrometers in the present embodiment), an upper radiation thermometer 25 and a lower radiation thermometer 20. The upper radiation thermometer 25 is installed obliquely above the semiconductor wafer W held by the susceptor 74, and the lower radiation thermometer 20 is provided obliquely below the semiconductor wafer W held by the susceptor 74.

Figure 10:
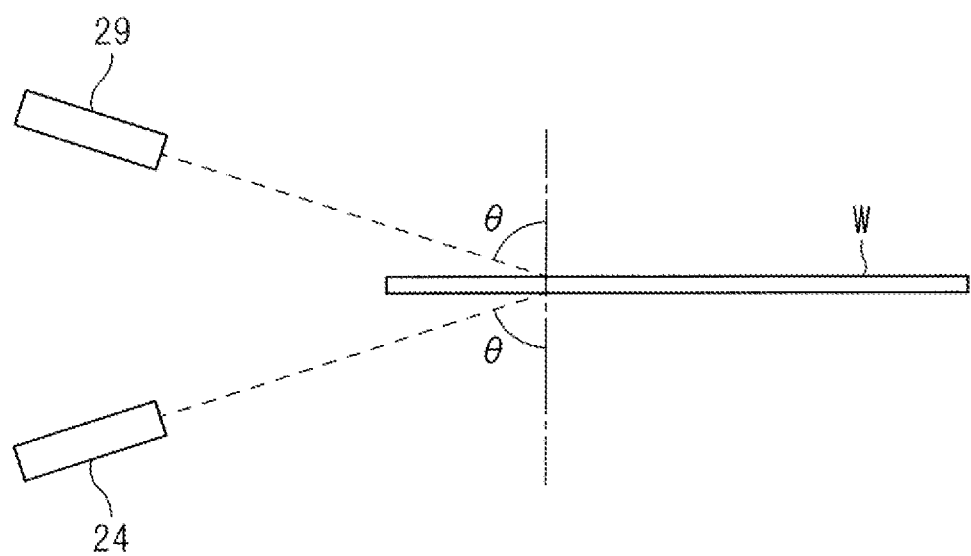
FIG. 10 is a diagram showing a positional relationship between the lower radiation thermometer and the semiconductor wafer W held by the susceptor.

FIG. 10 is a diagram showing a positional relationship between the lower radiation thermometer 20 and the semiconductor wafer W held by the susceptor 74.

An acceptance angle θ of the thermal infrared sensor 24 of the lower radiation thermometer 20 with respect to the semiconductor wafer W is 60° or more and 89° or less. The acceptance angle θ is an angle formed by the optical axis of the thermal infrared sensor 24 of the lower radiation thermometer 20 and the normal line (line perpendicular to the main surface) of the semiconductor wafer W. In addition, similarly, the acceptance angle θ of the quantum infrared sensor 29 of the upper radiation thermometer 25 with respect to the semiconductor wafer W is also 60° or more and 89° or less. It should be noted that the acceptance angle of the thermal infrared sensor 24 of the lower radiation thermometer 20 with respect to the semiconductor wafer W and the acceptance angle of the quantum infrared sensor 29 of the upper radiation thermometer 25 with respect to the semiconductor wafer W may not be equal to each other.

The control unit 3 controls the above-described various operating mechanisms provided in the heat treatment apparatus 160. The configuration of the control unit 3 as hardware is the same as that of a general computer. That is, the control unit 3 includes a CPU being a circuit that performs various types of arithmetic processing, a ROM being a read-only memory that stores basic programs, a RAM being a memory capable of reading and writing that stores various types of information, and a magnetic disk that stores control software, data, and the like. The CPU of the control unit 3 executes a predetermined processing program, whereby the treatment in the heat treatment apparatus 160 proceeds.

FIG. 11 is a functional block diagram showing a relationship among the lower radiation thermometer 20, the upper radiation thermometer 25, and the control unit 3.

The lower radiation thermometer 20 provided obliquely below the semiconductor wafer W and for measuring the temperature of the lower surface of the semiconductor wafer W includes a thermal infrared sensor 24 and a temperature measurement unit 22.

The thermal infrared sensor 24 receives infrared light radiated, through the opening 78, from the lower surface of the semiconductor wafer W held by the susceptor 74. The thermal infrared sensor 24 is electrically connected to the temperature measurement unit 22, and transmits a signal generated in response to light reception to the temperature measurement unit 22.

The temperature measurement unit 22 includes an amplifier circuit, an A/D converter, a temperature conversion circuit, and the like (not shown), and converts a signal indicating the intensity of infrared light output from the thermal infrared sensor 24 into a temperature. The temperature obtained by the temperature measurement unit 22 is the temperature of the lower surface of the semiconductor wafer W.

On the other hand, the upper radiation thermometer 25 provided obliquely above the semiconductor wafer W and for measuring the temperature of the upper surface of the semiconductor wafer W includes a quantum infrared sensor 29 and a temperature measurement unit 27. The quantum infrared sensor 29 receives infrared light radiated from the upper surface of the semiconductor wafer W held by the susceptor 74. The quantum infrared sensor 29 includes an InSb (indium antimony) optical element so as to be able to cope with a rapid temperature change on the upper surface of the semiconductor wafer W at the moment when irradiated with a flash of light. The quantum infrared sensor 29 is electrically connected to the temperature measurement unit 27, and transmits a signal generated in response to light reception to the temperature measurement unit 27. The temperature measurement unit 27 converts a signal indicating the intensity of infrared light output from the quantum infrared sensor 29 into a temperature. The temperature obtained by the temperature measurement unit 27 is the temperature of the upper surface of the semiconductor wafer W.

The lower radiation thermometer 20 and the upper radiation thermometer 25 are electrically connected to the control unit 3 being a controller of the entire heat treatment apparatus 160, and the temperatures of the lower surface and the upper surface of the semiconductor wafer W measured respectively by the lower radiation thermometer 20 and the upper radiation thermometer 25 are transmitted to the control unit 3.

The control unit 3 includes a coefficient calculation unit 31, a temperature correction unit 32, and an alarm unit 36. The coefficient calculation unit 31 and the temperature correction unit 32 are functional processing units implemented by the CPU of the control unit 3 executing a predetermined processing program. Processing contents of the coefficient calculation unit 31, the temperature correction unit 32, and the alarm unit 36 will be further described below. It should be noted that the alarm unit 36 does not need to be provided. In addition, an aspect may be used in which the control unit 3 does not include the coefficient calculation unit 31, and the correction coefficient calculated in advance is input to the input unit 34 or the display unit 33.

In addition, a display unit 33, an input unit 34, and a storage unit 35 are connected to the control unit 3. The control unit 3 causes the display unit 33 to display various pieces of information. The input unit 34 is an apparatus for an operator of the heat treatment system 100 to input various commands or parameters to the control unit 3. While checking the display contents of the display unit 33, the operator can also perform condition setting of the treatment recipe in which the treatment procedure and the treatment condition of the semiconductor wafer W are described from the input unit 34.

The storage unit 35 may be, for example, a memory (storage medium) including: an HDD; a volatile or nonvolatile semiconductor memory such as a RAM, a ROM, or a flash memory; a magnetic disk; a flexible disk; an optical disc; a compact disc; a mini disc; or a DVD.

As the display unit 33 and the input unit 34, a touch panel having both functions can also be used, and in the present embodiment, a liquid crystal touch panel provided on an outer wall of the heat treatment system 100 is adopted.

In addition to the above configuration, the heat treatment system 100 has various cooling structures in order to prevent excessive temperature rise of the halogen heating unit 4, the flash heating unit 5, and the chamber 6 due to the thermal energy generated from the halogen lamps HL and the flash lamps FL during the heat treatment of the semiconductor wafer W.

For example, a water cooling pipe (not shown) is provided on the wall of the chamber 6. In addition, the halogen heating unit 4 and the flash heating unit 5 have an air-cooling structure of forming a gas flow inside to exhaust heat. In addition, air is also supplied to the gap between the upper chamber window 63 and the lamp light radiation window 53 to cool the flash heating unit 5 and the upper chamber window 63.

<Operation of Heat Treatment System>

Figure 12:
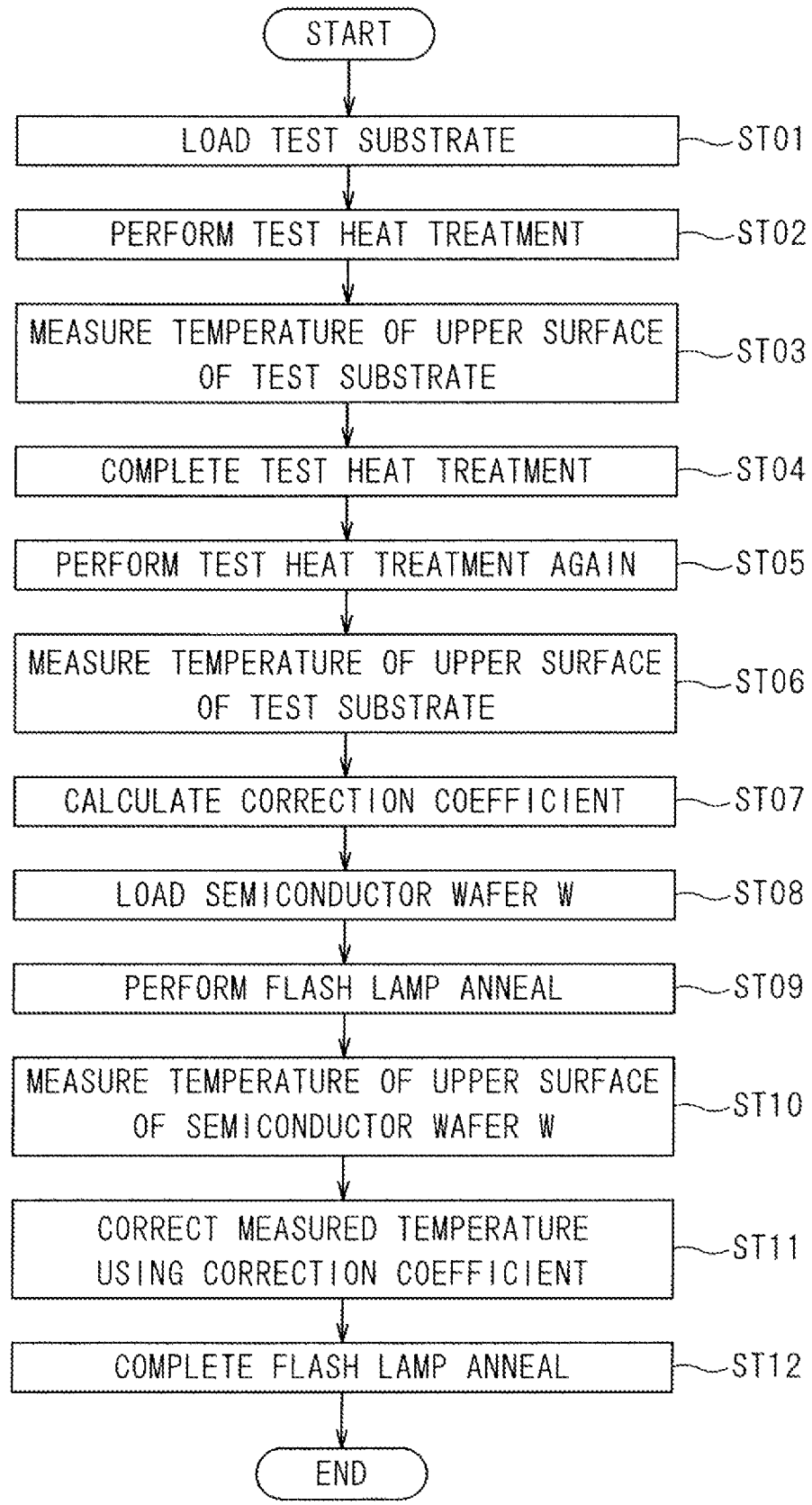
FIG. 12 is a flowchart for illustrating the operation of the heat treatment system according to the embodiment.

Next, an operation of the heat treatment system according to the present embodiment will be described. FIG. 12 is a flowchart for illustrating the operation of the heat treatment system according to the present embodiment. The following processing procedure of the heat treatment system 100 proceeds by the control unit 3 controlling each operation mechanism of the heat treatment system 100.

First, the valve 84 for air supply is opened, and the valves 89 and 192 for exhaust are opened to start air supply to and exhaust from the inside of the chamber 6. When the valve 84 is opened, nitrogen gas is supplied to the heat treatment space 65 from the gas supply hole 81. In addition, when the valve 89 is opened, the gas in the chamber 6 is exhausted from the gas exhaust hole 86.

Thus, the nitrogen gas supplied from the upper portion of the heat treatment space 65 in the chamber 6 flows downward and is exhausted from the lower portion of the heat treatment space 65. In addition, opening the valve 192 exhausts the gas in the chamber 6 also from the conveyance opening 66. Furthermore, an exhaust mechanism (not shown) exhausts also the atmosphere around the driving unit of the transfer mechanism 10.

It should be noted that during the heat treatment of the semiconductor wafer W or a test substrate in the heat treatment apparatus 160, nitrogen gas is continuously supplied to the heat treatment space 65, and the supply amount is appropriately changed according to the treatment step.

Subsequently, the gate valve 185 is opened and the conveyance opening 66 is opened, and the conveyance robot outside the apparatus loads the test substrate into the heat treatment space 65 in the chamber 6 through the conveyance opening 66 (step ST01).

Here, the test substrate is a substrate on which test heat treatment is performed prior to flash lamp anneal on the semiconductor wafer W to be treated, and is, for example, non-deposition. In addition, the test substrate is desirably a substrate having the same diameter and thickness as the semiconductor wafer W.

In addition, the test heat treatment is heat treatment performed on the test substrate prior to the flash lamp anneal performed on the semiconductor wafer W to be treated, and is, for example, heat treatment including irradiation with a flash of light.

It should be noted that although to be described as a test substrate in the present embodiment, the test substrate may be a semiconductor wafer W to be actually heat-treated. It is only necessary to know the amount of change in the output voltage of the quantum infrared sensor.

There is a risk that the atmosphere outside the apparatus may be sucked together with the loading of the test substrate, but since nitrogen gas continues to be supplied to the chamber 6, nitrogen gas flows out from the conveyance opening 66, and such suction of external atmosphere can be suppressed to the minimum.

The test substrate loaded in by the conveyance robot advances to a position immediately above the holding unit 7 and stops. Then, the pair of transfer arms 11 of the transfer mechanism 10 move horizontally from the retracted position to the transfer operation position and rise, whereby the lift pins 12 protrude from the upper surface of the holding plate 75 of the susceptor 74 through the through holes 79 and receive the test substrate. At this time, the lift pin 12 rises above the upper end of the substrate support pin 77.

After the test substrate is placed on the lift pins 12, the conveyance robot exits the heat treatment space 65, and the conveyance opening 66 is closed by the gate valve 185. Then, descent of the pair of transfer arms 11 causes the test substrate to be delivered from the transfer mechanism 10 to the susceptor 74 of the holding unit 7 and held in a horizontal attitude from below. The test substrate is supported by a plurality of substrate support pins 77 erected on the holding plate 75 and held by the susceptor 74. In addition, the test substrate is held by the holding unit 7 with the front-surface, being a surface to be treated, as an upper surface. A predetermined distance is formed between the lower surface (main surface opposite to the front surface) of the test substrate supported by the plurality of substrate support pins 77 and the holding surface 75a of the holding plate 75. The pair of transfer arms 11 lowered to below the susceptor 74 is retracted by the horizontal movement mechanism 13 to the retracted position, that is, inside the recessed portion 62.

Next, test heat treatment including irradiation with a flash of light is performed on the test substrate (step ST02). At this time, part of the flash of light radiated from the flash lamps FL goes directly into the chamber 6, the other part is once reflected by the reflector 52 and then goes into the chamber 6, and irradiation with these flashes of light flash-heats the test substrate.

Since the flash heating is performed by irradiation with a flash of light (flash) from the flash lamps FL, the front-surface temperature of the test substrate can be raised in a short time. That is, a flash of light applied from the flash lamps FL is an extremely short and strong flash with an irradiation time of about 0.1 ms or more and 100 ms or less obtained by converting the electrostatic energy stored in advance in the capacitor into an extremely short optical pulse. Then, the irradiation with a flash of light from the flash lamps FL causes the front-surface temperature of the test substrate to rapidly rise in an extremely short time.

Then, the temperature of the upper surface of the test substrate during the test heat treatment is measured using the quantum infrared sensor 29 of the upper radiation thermometer 25 (step ST03). The temperature of the upper surface of the test substrate measured in step ST03 is stored in the storage unit 35 as a reference temperature.

Then, after the temperature of the test substrate drops to a predetermined temperature or less, the pair of transfer arms 11 of the transfer mechanism 10 horizontally moves from the retracted position to the transfer operation position and rises again, whereby the lift pins 12 protrude from the upper surface of the susceptor 74 and receive the heat-treated test substrate from the susceptor 74. Subsequently, the conveyance opening 66 closed by the gate valve 185 is opened, the test substrate placed on the lift pins 12 is unloaded from the chamber 6 by the conveyance robot outside the apparatus, and the test heat treatment of the test substrate is completed (step ST04).

Here, as a timing of performing the test heat treatment, for example, a timing of initial calibration of the heat treatment system 100 (including initial calibration of the quantum infrared sensor 29) is assumed.

Next, test heat treatment is performed again on the test substrate by the same method (same setting value) as in steps ST01 to ST04 (step ST05). Then, the temperature of the upper surface of the test substrate during the test heat treatment is measured using the quantum infrared sensor 29 of the upper radiation thermometer 25 (step ST06). The temperature of the upper surface of the test substrate measured in step ST06 is stored in the storage unit 35 as a shift temperature.

As the timing of performing the test heat treatment again, for example, a maintenance timing of the heat treatment system 100 is assumed. In addition, when the heat treatment is consecutively performed on the respective semiconductor wafers W, a timing at which an abnormal state is detected during the heat treatment is also assumed. For example, when output voltages of the quantum infrared sensor 29 obtained by the irradiation with a flash of light are different by a predetermined value or more before and after the semiconductor wafers W to be heat-treated sequentially, the test heat treatment may be performed assuming that the output voltage of the quantum infrared sensor 29 has greatly changed.

Next, the coefficient calculation unit 31 of the control unit 3 calculates a correction coefficient based on the reference temperature and the shift temperature. Specifically, as shown in the following formula (1), the correction coefficient CF is calculated based on the reference temperature $T_{ref}$ and the shift temperature $T_{shift}$ (step ST07).

[Mathematical 1]

$$CF = \frac{T_{ref}}{T_{shift}} \quad (1)$$

Here, when the correction coefficient is outside the predetermined range (that is, when the difference between the reference temperature and the shift temperature exceeds a threshold value), the alarm unit 36 may issue an alarm to the operator using sound, image display, or the like. This is because the value of the correction coefficient becomes a value separated from 1 according as the change (sensitivity shift) in the output voltage of the quantum infrared sensor 29 increases, and when the sensitivity shift is excessively large, a defect of the quantum infrared sensor 29 and a defect of another configuration in the chamber 6 (such as contamination of the transparent window 26) are also assumed.

Next, the semiconductor wafer W to be treated is loaded into the heat treatment space 65 in the chamber 6 (step ST08). Then, flash lamp anneal of irradiating the semiconductor wafer W with a flash of light is performed (step ST09). Then, the temperature of the upper surface of the semiconductor wafer W during the flash lamp anneal is measured using the quantum infrared sensor 29 of the upper radiation thermometer 25 (step ST10). The temperature of the upper surface of the semiconductor wafer W measured in step ST10 is stored in the storage unit 35 as a measured temperature.

Next, the temperature correction unit 32 of the control unit 3 corrects the measured temperature measured in step ST10 using the correction coefficient stored in the storage unit 35. Specifically, as shown in the following formula (2), the measured temperature $T_{measure}$ is corrected to the corrected measured temperature $T'_{measure}$ using the correction coefficient CF (step ST11).

[Mathematical 2]

$$T'_{measure} = CF \times T_{measure} \quad (2)$$

Then, the semiconductor wafer W is unloaded from the chamber 6 by the conveyance robot outside the apparatus, and the flash lamp anneal of the semiconductor wafer W is completed (step ST12).

It should be noted that, in step ST11, the correction coefficient is corrected by referring to the correction coefficient stored in the storage unit 35, but instead of using the correction coefficient calculated by the coefficient calculation unit 31 and stored in the storage unit 35, the operator may obtain the correction coefficient by manual calculation or the like and directly input the correction coefficient through the input unit 34, and the temperature correction unit 32 of the control unit 3 may correct the measured temperature $T_{measure}$ to the corrected measured temperature $T'_{measure}$ from the input unit 34 using the correction coefficient.

According to the above embodiment, by referring to the corrected measured temperature $T'_{measure}$, the control unit 3 can measure the temperature of the upper surface of the semiconductor wafer W with high accuracy even when the output voltage of the quantum infrared sensor 29 changes with a lapse of time. Therefore, it is possible to appropriately confirm whether or not the flash lamp anneal is appropriately performed. For example, when the corrected measured temperature $T'_{measure}$ is out of the assumed temperature range, the control unit 3 can adjust the output value or the irradiation time of the flash lamp.

It should be noted that in the above embodiment, each of the reference temperature and the shift temperature is measured once, but at least one of the reference temperature and the shift temperature may be an average value of the temperatures of the test substrate measured a plurality of times.

In addition, when the infrared sensor used in the lower radiation thermometer 20 is a quantum infrared sensor, the coefficient calculation unit 31 of the control unit 3 may also calculate a correction coefficient used for correction of a measured temperature measured by the quantum infrared sensor used in the lower radiation thermometer 20.

Second Embodiment

A heat treatment apparatus and a heat treatment method in the heat treatment system according to the present embodiment will be described. It should be noted that in the following description, the same components as those described in the embodiments described above are denoted by the same reference numerals and illustrated, and the detailed description thereof will be appropriately omitted.

Figure 13:
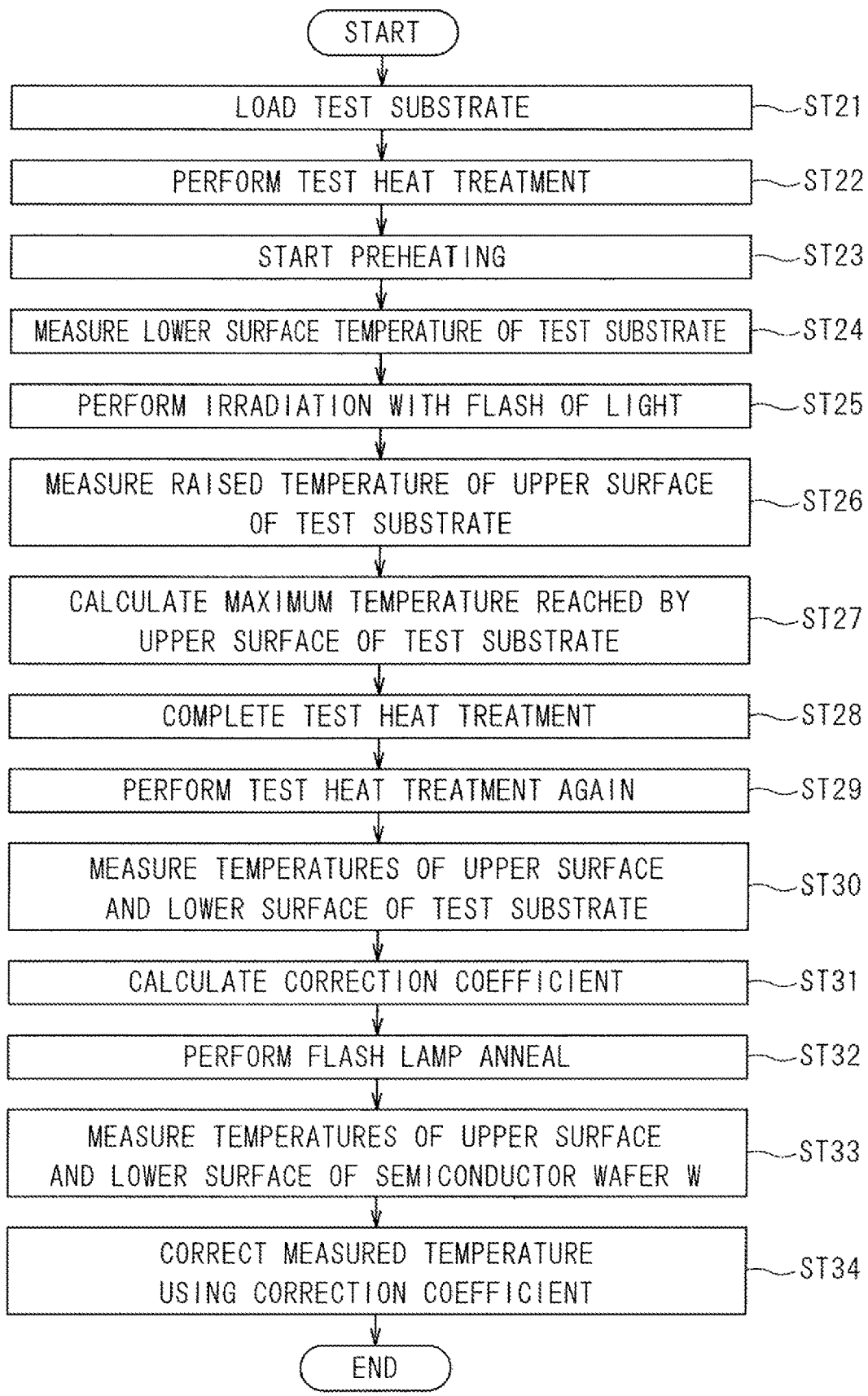
FIG. 13 is a flowchart for illustrating the operation of the heat treatment system according to the embodiment.

Next, an operation of the heat treatment system according to the present embodiment will be described. FIG. 13 is a flowchart for illustrating the operation of the heat treatment system according to the present embodiment. The following processing procedure of the heat treatment system 100 proceeds by the control unit 3 controlling each operation mechanism of the heat treatment system 100.

First, as in step ST01 in the first embodiment, a test substrate is loaded (step ST21). Then, preheating (assist heating) and test heat treatment including irradiation with a flash of light are performed on the test substrate (step ST22).

Figure 14:
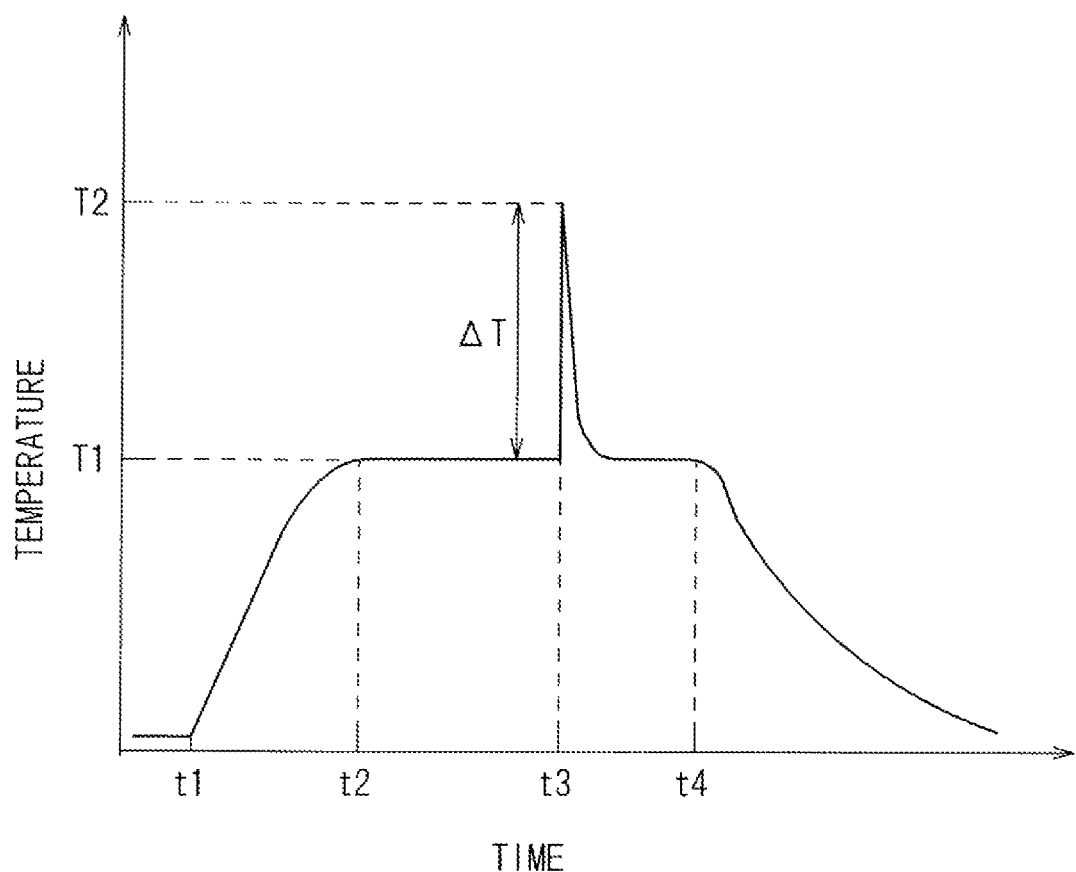
FIG. 14 is a diagram showing a change in the front-surface temperature of the test substrate.

FIG. 14 is a diagram showing a change in the front-surface temperature of the test substrate. It should be noted that even in a semiconductor wafer W described below, a change in the front-surface temperature as shown in FIG. 14 is shown by flash lamp anneal.

After the test substrate is loaded into the chamber 6 and held by the susceptor 74, the 40 halogen lamps HL of the halogen heating unit 4 are turned on all at once at time t1 and preheating (assist heating) is started (step ST23). Halogen light emitted from the halogen lamps HL passes through the lower chamber window 64 and the susceptor 74 made of quartz, and is applied to the lower surface of the test substrate. Receiving the light irradiation from the halogen lamps HL preheats the test substrate and raises its temperature.

It should be noted that since the transfer arms 11 of the transfer mechanism 10 are retracted inside the recessed portion 62, the transfer arms 11 do not hinder heating by the halogen lamps HL.

The temperature of the test substrate raised by light irradiation from the halogen lamps HL is measured by the lower radiation thermometer 20. That is, the lower radiation thermometer 20 receives infrared light radiated through the opening 78 from the lower surface of the test substrate held by the susceptor 74 through the transparent window 21 and measures the lower surface temperature of the test substrate (step ST24).

The temperature measurement by the lower radiation thermometer 20 may be started before the preheating by the halogen lamps HL is started.

The lower surface temperature of the test substrate measured by the lower radiation thermometer 20 is transmitted to the control unit 3. The lower surface temperature of the test substrate before the test heat treatment is stored in the storage unit 35 as a reference temperature (assist).

The control unit 3 controls the output of the halogen lamps HL while monitoring whether or not the temperature of the test substrate to be raised by light irradiation from the halogen lamps HL has reached a predetermined preheating temperature T1. That is, the control unit 3 feedback-controls the output of the halogen lamps HL so that the temperature of the test substrate reaches the preheating temperature T1 based on the measured value by the lower radiation thermometer 20.

As described above, the lower radiation thermometer 20 is also a temperature sensor for controlling the output of the halogen lamps HL in the preheating stage. It should be noted that although the lower radiation thermometer 20 measures the temperature of the lower surface of the test substrate, there is no temperature difference between the upper and lower surfaces of the test substrate at the stage of preheating by the halogen lamps HL, and the lower surface temperature measured by the lower radiation thermometer 20 can be regarded as the temperature of the entire test substrate.

After the temperature of the test substrate reaches the preheating temperature T1, the control unit 3 maintains the test substrate at the preheating temperature T1 for a while. Specifically, at time t2 when the temperature of the test substrate measured by the lower radiation thermometer 20 reaches the preheating temperature T1, the control unit 3 adjusts the output of the halogen lamps HL and maintains the temperature of the test substrate at almost the preheating temperature T1.

Performing preheating with these halogen lamps HL uniformly raises temperature of the entire test substrate to the preheating temperature T1. At the stage of preheating with the halogen lamps HL, the temperature of the circumferential edge portion of the test substrate which is more likely to radiate heat tends to be lower than that of the central portion, but the arrangement density of the halogen lamps HL in the halogen heating unit 4 is higher in the region facing the circumferential edge portion than in the region facing the central portion of the test substrate. Therefore, the amount of light applied to the circumferential edge portion of the test substrate which is more likely to radiate heat increases, and the in-plane temperature distribution of the test substrate in the preheating stage can be made uniform.

At time t3 when a predetermined time has elapsed since the temperature of the test substrate reached the preheating temperature T1, the flash lamps FL of the flash heating unit 5 perform irradiation with a flash of light, as test heat treatment, on the upper surface of the test substrate held by the susceptor 74 (step ST25).

The front-surface temperature of the test substrate is monitored by the upper radiation thermometer 25. However, the upper radiation thermometer 25 does not measure the absolute temperature of the upper surface of the test substrate, but measures the temperature change of the upper surface. That is, the quantum infrared sensor 29 of the upper radiation thermometer 25 removes the offset component by AC coupling or the like, and further refers to the lower radiation thermometer 20 to calculate the difference from the voltage value corresponding to the preheating temperature T1, thereby measuring the raised temperature (jump temperature) ΔT of the upper surface of the test substrate from the preheating temperature T1 at the time of irradiation with a flash of light (step ST26).

It should be noted that although the lower surface temperature of the test substrate is measured by the lower radiation thermometer 20 also at the time of the irradiation with a flash of light, when a flash of light extremely short in irradiation time with high intensity is applied, only the vicinity of the front-surface of the test substrate is rapidly heated, and therefore, a temperature difference occurs between the upper and lower surfaces of the test substrate, and the temperature of the upper surface of the test substrate cannot be measured by the lower radiation thermometer 20. In addition, similarly to the lower radiation thermometer 20, since the acceptance angle of the upper radiation thermometer 25 with respect to the test substrate is also 60° or more and 89° or less, the raised temperature ΔT of the upper surface of the test substrate can accurately measured by the upper radiation thermometer 25.

Next, the control unit 3 calculates the maximum temperature reached by the upper surface of the test substrate at the time of irradiation with a flash of light (step ST27). The temperature of the lower surface of the test substrate is continuously measured by the lower radiation thermometer 20 at least from time t2 when the test substrate reaches a certain temperature at the time of preheating to time t3 when a flash of light is applied.

There is no temperature difference between the upper and lower surfaces of the test substrate in the preheating stage before the irradiation with a flash of light, and the lower surface temperature of the test substrate measured by the lower radiation thermometer 20 before the irradiation with a flash of light is also the upper surface temperature. The control unit 3 calculates the maximum reaching temperature T2 of the upper surface by adding the raised temperature ΔT of the upper surface of the test substrate at the time of irradiation with a flash of light measured by the upper radiation thermometer 25 to the temperature (preheating temperature T1) of the lower surface of the test substrate measured by the lower radiation thermometer 20 from time t2 immediately before the irradiation with a flash of light to time t3. The calculated maximum reaching temperature T2 is stored in the storage unit 35 as a reference temperature (jump). The control unit 3 may display the calculated maximum reaching temperature T2 on the display unit 33.

After the irradiation with a flash of light is completed, the halogen lamps HL are turned off at time t4 after a lapse of a predetermined time Thus, the test substrate rapidly drops in temperature from the preheating temperature T1. The temperature of the test substrate during the temperature drop is measured by the lower radiation thermometer 20, and the measurement result is transmitted to the control unit 3. The control unit 3 monitors whether the temperature of the test substrate has fallen to a predetermined temperature from the measurement result of the lower radiation thermometer 20.

Then, after the temperature of the test substrate drops to a predetermined temperature or less, the pair of transfer arms 11 of the transfer mechanism 10 horizontally moves from the retracted position to the transfer operation position and rises again, whereby the lift pins 12 protrude from the upper surface of the susceptor 74 and receive the heat-treated test substrate from the susceptor 74. Subsequently, the conveyance opening 66 closed by the gate valve 185 is opened, the test substrate placed on the lift pins 12 is unloaded from the chamber 6 by the conveyance robot outside the apparatus, and the preheating (assist heating) and the test heat treatment of the test substrate are completed (step ST28).

Next, preheating (assist heating) and test heat treatment are performed again on the test substrate by the same method (same setting value) as in steps ST21 to ST28 (step ST29). Then, the lower surface temperature of the test substrate measured using the thermal infrared sensor 24 of the lower radiation thermometer 20 during the test heat treatment is stored in the storage unit 35 as a shift temperature (assist), and the raised temperature (jump temperature) of the upper surface of the test substrate of the test substrate measured using the quantum infrared sensor 29 of the upper radiation thermometer 25 during the test heat treatment is stored in the storage unit 35 as a shift temperature (jump) (step ST30).

Next, the coefficient calculation unit 31 of the control unit 3 calculates a correction coefficient based on the reference temperature (jump), the reference temperature (assist), the shift temperature (jump), and the shift temperature (assist). Specifically, as shown in the following formula (3), the correction coefficient CF is calculated based on the reference temperature $T_{ref(as)}$, the reference temperature $T_{ref(ju)}$, the shift temperature $T_{shift(as)}$, and the shift temperature $T_{shift(ju)}$ (step ST31).

[Mathematical 3]

$$CF = \frac{T_{ref(ju)}}{T_{shift(ju)}} = \frac{T_{ref} - T_{ref(as)}}{T_{shift} - T_{shift(as)}} \qquad (3)$$

Next, the flash lamp anneal is performed on the semiconductor wafer W to be treated by the same method as in steps ST21 to ST28 (step ST32). Here, various setting values (for example, the output value of a flash of light, the irradiation time of a flash of light, or the like) at the time of performing the flash lamp anneal are not necessarily the same as those of the preheating (assist heating) and the test heat treatment.

Then, the lower surface temperature of the semiconductor wafer W measured using the thermal infrared sensor 24 of the lower radiation thermometer 20 during the flash lamp anneal is stored in the storage unit as a measured temperature (assist), and the raised temperature (jump temperature) of the upper surface of the semiconductor wafer W measured using the quantum infrared sensor 29 of the upper radiation thermometer 25 during the flash lamp anneal is stored in the storage unit 35 as a measured temperature (jump) (step ST33).

Next, the temperature correction unit 32 of the control unit 3 corrects the measured temperature measured in step ST33 using the correction coefficient stored in the storage unit 35. Specifically, as shown in the following formula (4), the measured temperature (jump) $T_{measure(ju)}$ and the measured temperature (assist) $T_{measure(as)}$ are corrected to the corrected measured temperature $T'_{measure}$ using the correction coefficient CF (step ST34).

[Mathematical 4]

$$T'_{measure} = CF \times T_{measure(ju)} + T_{measure(as)} \qquad (4)$$

According to the above embodiment, by referring to the corrected measured temperature $T'_{measure}$, the control unit 3 can measure the temperature of the upper surface of the semiconductor wafer W with high accuracy even when the output voltage of the quantum infrared sensor 29 changes with a lapse of time. Therefore, it is possible to appropriately confirm whether or not the flash lamp anneal is appropriately performed.

In addition, by considering the assist temperature, the temperature of the upper surface of the semiconductor wafer W can be measured with high accuracy by multiplying only the raised temperature (jump temperature) of the upper surface of the semiconductor wafer W affected by the change in the output voltage of the quantum infrared sensor 29 by the correction coefficient. That is, it is possible to perform temperature measurement also in consideration of a change in thermal conductivity of the semiconductor wafer W (particularly, silicon) due to preheating (assist heating).

Third Embodiment

A heat treatment apparatus and a heat treatment method in the heat treatment system according to the present embodiment will be described. It should be noted that in the following description, the same components as those described in the embodiments described above are denoted by the same reference numerals and illustrated, and the detailed description thereof will be appropriately omitted.

When the temperature correction unit 32 corrects the measured temperature (jump) $T_{measure(ju)}$ and the measured temperature (assist) $T_{measure(as)}$ to the corrected measured temperature $T'_{measure}$ using the correction coefficient CF, the correction r accuracy may decrease depending on a condition such as a pulse waveform corresponding to the light emitting time of the flash lamp FL.

Therefore, in the present embodiment, variation in correction accuracy due to the difference in the treatment recipe is suppressed by acquiring the reference temperature $T_{ref}$ different for each treatment recipe according to the condition of the treatment recipe of the semiconductor wafer W that may be used, such as the pulse waveform, the charging voltage, the assist temperature, or the zone offset value, and further acquiring a plurality of corresponding correction coefficients CF. Here, the zone offset value is an offset value when the charging voltage of the portion arranged to face the central portion of the substrate W of the flash lamps FL shown in FIG. 3 is set to be lower than the charging voltage of the portion arranged to face the circumferential edge portion of the substrate W.

In addition, the correction coefficient CF may be, for example, a correction coefficient CF (pw, cv, as, zo) including four variables of a pulse waveform pw being a variable of the light emitting time, a charging voltage cv being a variable of the light emission intensity, an assist heating temperature as corresponding to the preheating temperature T1 in FIG. 14, and a zone offset value zo. In that case, for example, when the variable pw changes, another variable may be fixed as a predetermined reference value.

Fourth Embodiment

A heat treatment apparatus and a heat treatment method in the heat treatment system according to the present embodiment will be described. It should be noted that in the following description, the same components as those described in the embodiments described above are denoted by the same reference numerals and illustrated, and the detailed description thereof will be appropriately omitted.

The plurality of correction coefficients CF obtained in the third embodiment can be held in a correction coefficient table.

FIG. 15 is a diagram schematically showing an example of a correction coefficient table that holds a correction coefficient CF for each treatment recipe. In FIG. 15, a plurality of correction coefficients CF are held correspondingly to the correction coefficient number according to the difference in the pulse waveform, the charging voltage, the assist temperature, and the zone offset value in the treatment recipe.

In addition, the correction coefficient CF (pw, cv, as, zo) including the variables obtained in the third embodiment can be made selectable by designating the respective variables.

Figure 16:
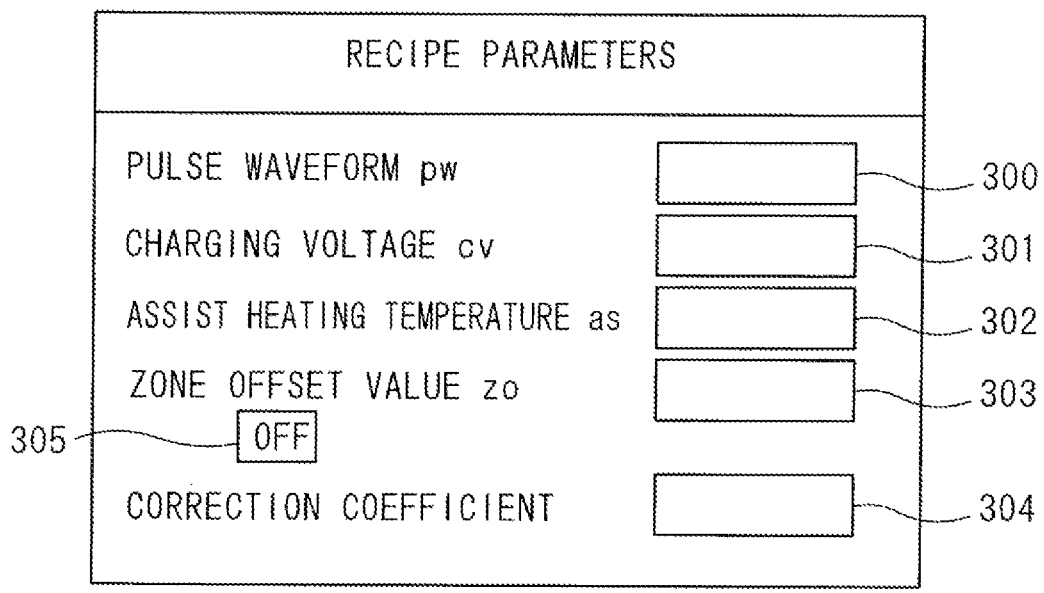
FIG. 16 is a diagram showing an example of a GUI screen for inputting the respective variables of the correction coefficient including variables.

FIG. 16 is a diagram showing an example of a GUI screen for inputting the respective variables of the correction coefficient CF (pw, cv, as, zo) including variables. In FIG. 16, the respective variables of the correction coefficient CF (pw, cv, as, zo) can be designated in the designation fields 300, 301, 302, and 303 by direct input, pull-down format, or the like, and the correction coefficient (or the corresponding correction coefficient number) corresponding to the input variables is displayed in the designation field 304 by the calculation of the control unit 3. However, a correction coefficient (or the corresponding correction coefficient number) may be directly input to the designation field 304. It should be noted that when the voltage value is designated in the designation field 303, the switching display field 305 of a zone offset value is displayed by switching from the off state to the on state, but a setting button or the like for switching the zone offset may be separately provided.

Fifth Embodiment

A heat treatment apparatus and a heat treatment method in the heat treatment system according to the present embodiment will be described. It should be noted that in the following description, the same components as those described in the embodiments described above are denoted by the same reference numerals and illustrated, and the detailed description thereof will be appropriately omitted.

The plurality of correction coefficients CF obtained in the third and fourth embodiments may be stored in the library, and the control unit 3 may automatically select the correction coefficient CF suitable for the treatment recipe from the library when any treatment recipe is created.

The control unit 3 may select a correction coefficient CF suitable for the treatment recipe by an optimization method. For example, the correction coefficients CF corresponding to the charging voltages cv of a plurality of patterns may be held, and when any charging voltage cv is input, the optimum correction coefficient CF may be estimated by curve fitting by the least squares method.

In addition, the control unit 3 may select a correction coefficient CF suitable for the treatment recipe by machine learning. For example, a learned model having learned by a neural network or the like with the four variables (pulse waveform pw, charging voltage cv, assist heating temperature as, and zone offset value zo) and the corresponding correction coefficient CF as teacher data and capable of outputting the optimum correction coefficient CF based on the input of the four variables may be installed in the control unit 3.

Effects Produced by Embodiments Described Above

Next, examples of effects produced by the above-described embodiments will be shown. It should be noted that in the following description, the effect is described based on the specific configuration exemplified in the above-described embodiments, but in the scope where the same effect is produced, the configuration may be replaced with other specific configurations exemplified in the specification of the present application.

In addition, the replacement may be performed across a plurality of embodiments. That is, the case may be used where the same effects are produced by combining the respective configurations exemplified in different embodiments.

According to the embodiments described above, the heat treatment apparatus includes a quantum infrared sensor 29, a coefficient calculation unit 31, and a temperature correction unit 32. The quantum infrared sensor 29 measures the temperature of the first substrate and the temperature of the second substrate. Here, the first substrate corresponds to, for example, a test substrate. In addition, the second substrate corresponds to, for example, a semiconductor wafer W. Here, the temperature of the test substrate on which the first heat treatment having irradiation with a flash of light is performed, the temperature being measured by the quantum infrared sensor 29, is defined as a reference temperature. It should be noted that the first heat treatment corresponds to, for example, test heat treatment. In addition, the temperature of the test substrate on which the test heat treatment is performed and then the test heat treatment is performed again, to be measured by the quantum infrared sensor 29, is defined as a shift temperature. The coefficient calculation unit 31 calculates a correction coefficient based on the reference temperature and the shift temperature. In addition, the temperature correction unit 32 corrects a temperature of the semiconductor wafer W on which the second heat treatment having irradiation with a flash of light is performed, the temperature being measured by the quantum infrared sensor 29, using the correction coefficient. Here, the second heat treatment corresponds to, for example, flash lamp anneal.

According to this configuration, by correcting the temperature of the semiconductor wafer W using the correction coefficient, the temperature of the upper surface of the semiconductor wafer W can be measured with high accuracy even when the output voltage of the quantum infrared sensor 29 changes with a lapse of time. Therefore, it is possible to appropriately confirm whether or not the flash lamp anneal is appropriately performed.

In addition, since the measured temperature is directly corrected with the correction coefficient, for example, as compared with a case where the output voltage of the quantum infrared sensor 29 is corrected, the range in which the correction coefficient can be applied extends also to other apparatuses and the like that do not use a voltage. For example, the output may be corrected using a predetermined correction coefficient with respect to a measured temperature measured by another sensor included in a heat treatment apparatus different from the heat treatment apparatus including the quantum infrared sensor that calculates a predetermined correction coefficient. Furthermore, when temperatures at a plurality of portions on the front-surface of the semiconductor wafer W are measured by a plurality of sensors included in the heat treatment apparatus, the output of each sensor may be corrected with a predetermined correction coefficient.

It should be noted that even when another configuration exemplified in the specification of the present application is appropriately added to the above configuration, that is, even when another configuration in the specification of the present application not referred to as the above configuration is appropriately added, a similar effect can be produced.

In addition, according to the embodiments described above, the coefficient calculation unit 31 calculates the correction coefficient based on the ratio between the reference temperature and the shift temperature. According to this configuration, by correcting the temperature of the semiconductor wafer W using the correction coefficient, the temperature of the upper surface of the semiconductor wafer W can be measured with high accuracy even when the output voltage of the quantum infrared sensor 29 changes with a lapse of time.

In addition, according to the embodiments described above, at least one of the reference temperature and the shift temperature is defined as an average value of temperatures of the test substrate measured a plurality of times. According to this configuration, since the measurement accuracy of at least one of the reference temperature and the shift temperature is enhanced, the accuracy of the correction coefficient is also enhanced.

In addition, according to the embodiments described above, the heat treatment apparatus 160 includes an alarm unit 36 for issuing an alarm when the difference between the reference temperature and the shift temperature exceeds a threshold value. According to this configuration, when the sensitivity shift is excessively large, a defect of the quantum infrared sensor 29, and further, a defect of another configuration in the chamber 6 (such as contamination of the transparent window 26) and the like can be assumed.

In addition, according to the embodiments described above, the quantum infrared sensor 29 measures the temperature on at least the upper surface irradiated with a flash of light of the test substrate. Then, the heat treatment apparatus 160 includes a lower surface thermometer for measuring a temperature on at least the lower surface of the test substrate. Here, the lower surface thermometer corresponds to, for example, the lower radiation thermometer 20. In addition, the temperature on the lower surface of the test substrate before the test heat treatment is performed, which is measured by the lower radiation thermometer 20, is defined as an assist temperature. Then, the coefficient calculation unit 31 calculates a correction coefficient based on the reference temperature, the shift temperature, and the assist temperature. According to this configuration, by considering the assist temperature, the temperature of the upper surface of the semiconductor wafer W can be measured with high accuracy by multiplying only the raised temperature (jump temperature) of the upper surface of the semiconductor wafer W affected by the change in the output voltage of the quantum infrared sensor 29 by the correction coefficient.

In addition, according to the embodiments described above, the coefficient calculation unit 31 calculates the correction coefficient based on the ratio between the difference between the reference temperature and the assist temperature and the difference between the shift temperature and the assist temperature. According to this configuration, the temperature of the upper surface of the semiconductor wafer W can be measured with high accuracy by multiplying only the raised temperature (jump temperature) of the upper surface of the semiconductor wafer W by the correction coefficient.

According to the embodiment described above, the heat treatment method includes: measuring, using a quantum infrared sensor 29, a temperature of the test substrate on which test heat treatment having irradiation with the flash of light is performed, and defining a temperature of the test substrate as a reference temperature; measuring again a temperature of the test substrate on which the test heat treatment is performed using the quantum infrared sensor 29 after the test heat treatment is performed, and defining a temperature of the test substrate as a shift temperature; and correcting a temperature of the semiconductor wafer W on which flash lamp anneal having irradiation with the flash of light is performed, the temperature being measured by the quantum infrared sensor 29, using a correction coefficient calculated based on the reference temperature and the shift temperature.

According to this configuration, by correcting the temperature of the semiconductor wafer W using the correction coefficient, the temperature of the upper surface of the semiconductor wafer W can be measured with high accuracy even when the output voltage of the quantum infrared sensor 29 changes with a lapse of time.

It should be noted that when there is no particular limitation, the order in which each piece of treatment is performed can be changed.

It should be noted that even when another configuration exemplified in the specification of the present application is appropriately added to the above configuration, that is, even when another configuration in the specification of the present application not referred to as the above configuration is appropriately added, a similar effect can be produced.

Modifications of Embodiments Described Above

In the embodiments described above, quality of material, material, dimensions, shape, relative arrangement relationship, or condition of implementation of each component may be described, but these are one example in all aspects, and the present invention is assumed not to be limited to those described in the specification of the present application.

Therefore, innumerable modifications not exemplified and their equivalents are assumed within the scope of the techniques disclosed in the specification of the present application. For example, a case of deforming, adding, or omitting at least one component, and furthermore, a case of extracting at least one component in at least one embodiment to combine the extracted component with a component in another embodiment are assumed to be included.

In addition, in the embodiments described above, when a material name or the like is described without being particularly designated, as long as no contradiction occurs, the material is assumed to include a material that contains other additives, such as an alloy.

EXPLANATION OF REFERENCE SIGNS

3: control unit
4: halogen heating unit
5: flash heating unit
6: chamber
7: holding unit
10: transfer mechanism
11: transfer arm
12: lift pin
13: horizontal movement mechanism
14: elevating mechanism
20: lower radiation thermometer
21, 26: transparent window
22, 27: temperature measurement unit
24: thermal infrared sensor
25: upper radiation thermometer
29: quantum infrared sensor
31: coefficient calculation unit
32: temperature correction unit
33: display unit
34: input unit
35: storage unit
36: alarm unit
41, 51: housing
43, 52: reflector
53: lamp light radiation window
61: chamber side portion
61a, 61b, 79: through hole
62: recessed portion
63: upper chamber window
64: lower chamber window
65: heat treatment space
66: conveyance opening
68, 69: reflective ring
71: base ring
72: coupling portion
74: susceptor
75: holding plate
75a: holding surface
76: guide ring
77: substrate support pin
78: opening
81: gas supply hole
82, 87: buffer space
83: gas supply tube
84, 89, 192: valve
85: treatment gas supply source
86: gas exhaust hole
88, 191: gas exhaust tube
100: heat treatment system
101: indexer unit
110: load port
120: delivery robot
120R, 120S, 150R: arrow
121: hand
130, 140: cooling unit
131: first cooling chamber
141: second cooling chamber
150: conveyance robot
151a, 151b: conveyance hand
160: heat treatment apparatus
170: conveyance chamber
181, 182, 183, 184, 185: gate valve
190: exhaust unit
230: alignment unit
231: alignment chamber
300, 301, 302, 303, 304: designation field
305: switching display field

The invention claimed is:

1. A heat treatment apparatus configured to heat a first substrate and a second substrate by irradiation with a flash of light, the heat treatment apparatus comprising a quantum infrared sensor configured to measure a temperature of the first substrate and a temperature of the second substrate,
wherein a temperature of the first substrate on which first heat treatment having irradiation with the flash of light is performed, the temperature being measured by the quantum infrared sensor, is defined as a reference temperature,
wherein a temperature of the first substrate on which the first heat treatment is performed and then the first heat treatment is performed again, the temperature being measured by the quantum infrared sensor, is defined as a shift temperature, and
the heat treatment apparatus further comprising a temperature correction unit configured to correct, using a correction coefficient calculated based on the reference temperature and the shift temperature, a temperature of the second substrate on which second heat treatment having irradiation with the flash of light is performed, the temperature being measured by the quantum infrared sensor.

2. The heat treatment apparatus according to claim 1, wherein the correction coefficient is calculated based on a ratio between the reference temperature and the shift temperature.

3. The heat treatment apparatus according to claim 1, wherein the correction coefficient is calculated based on the reference temperature and the shift temperature, at least one of the reference temperature and the shift temperature being an average value of temperatures of the first substrate measured a plurality of times.

4. The heat treatment apparatus according to claim 1, further comprising an alarm unit configured to issue an alarm when a difference between the reference temperature and the shift temperature exceeds a threshold value.

5. The heat treatment apparatus according to claim 1, wherein the quantum infrared sensor measures a temperature on at least an upper surface irradiated with the flash of light of the first substrate,
the heat treatment apparatus further comprising a lower surface thermometer configured to measure a temperature on at least a lower surface of the first substrate,
wherein a temperature on a lower surface of the first substrate before the first heat treatment is performed, the temperature being measured by the lower surface thermometer, is defined as an assist temperature, and
wherein the temperature correction unit corrects a temperature of the second substrate using the correction coefficient calculated based on the reference temperature, the shift temperature, and the assist temperature.

6. The heat treatment apparatus according to claim 5, wherein the correction coefficient is calculated based on a ratio between a difference between the reference temperature and the assist temperature and a difference between the shift temperature and the assist temperature.

7. A heat treatment method for heating a first substrate and a second substrate by irradiation with a flash of light, the heat treatment method comprising:
measuring, using a quantum infrared sensor, a temperature of the first substrate on which first heat treatment having irradiation with the flash of light is performed, and defining a measured temperature of the first substrate as a reference temperature;
measuring again a temperature of the first substrate on which the first heat treatment is performed using the quantum infrared sensor after the first heat treatment is performed, and defining a temperature of the first substrate measured again as a shift temperature; and
correcting a temperature of the second substrate on which second heat treatment having irradiation with the flash of light is performed, the temperature being measured by the quantum infrared sensor, using a correction coefficient calculated based on the reference temperature and the shift temperature.

* * * * *